(12) United States Patent  (10) Patent No.: US 7,139,202 B2
Matsuoka et al.  (45) Date of Patent: Nov. 21, 2006

(54) SEMICONDUCTOR STORAGE DEVICE, MOBILE ELECTRONIC APPARATUS, AND METHOD FOR CONTROLLING THE SEMICONDUCTOR STORAGE DEVICE

(75) Inventors: Nobuaki Matsuoka, Tenri (JP); Masaru Nawaki, Nara (JP); Yoshinao Morikawa, Ikoma (JP); Hiroshi Iwata, Nara (JP); Akihide Shibata, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 131 days.

(21) Appl. No.: 10/850,806

(22) Filed: May 20, 2004

(65) Prior Publication Data

US 2004/0262666 A1 Dec. 30, 2004

(30) Foreign Application Priority Data

May 20, 2003 (JP) ............................. 2003-142541

(51) Int. Cl.
*G11C 7/10* (2006.01)
(52) U.S. Cl. ............................. 365/189.01; 365/185.22; 365/185.18; 257/314
(58) Field of Classification Search ............ 365/189.01, 365/204, 185.22, 185.18; 257/314
See application file for complete search history.

(56) References Cited

U.S. PATENT DOCUMENTS

| 5,265,059 | A | | 11/1993 | Wells et al. |
| 5,729,035 | A | * | 3/1998 | Anma ........................ 257/324 |
| 5,818,791 | A | * | 10/1998 | Tanaka et al. .......... 365/230.06 |
| 5,838,041 | A | | 11/1998 | Sakagami et al. |
| 5,929,480 | A | | 7/1999 | Hisamune |
| 6,229,731 | B1 | * | 5/2001 | Kasai et al. ............ 365/185.04 |
| 6,788,615 | B1 | * | 9/2004 | Becker ........................ 365/233 |
| 6,928,152 | B1 | * | 8/2005 | Takeda et al. .......... 379/207.02 |
| 7,009,884 | B1 | * | 3/2006 | Yaoi et al. .............. 365/185.22 |
| 7,023,731 | B1 | * | 4/2006 | Hamaguchi et al. ... 365/185.14 |
| 2003/0164517 | A1 | | 9/2003 | Kamei et al. |
| 2005/0002258 | A1 | * | 1/2005 | Iwase et al. ................ 365/222 |

* cited by examiner

*Primary Examiner*—Anh Phung
*Assistant Examiner*—Eric J. Wendler
(74) *Attorney, Agent, or Firm*—Morrison & Foerster LLP

(57) ABSTRACT

A semiconductor storage device is provided, which comprises a memory array comprising memory elements, a write state machine for applying a first voltage for performing a write or erase operation, with respect to one of the memory elements, to the memory element via a bit line connected thereto, and thereafter, applying a second voltage for verifying whether or not the write or erase operation has been performed, to the memory element via the bit line, and a reset portion for grounding the bit line connected to the memory element after the write state machine has applied the first voltage and before the write state machine has applied the second voltage. Each memory element comprises a gate electrode, a channel region, diffusion regions, and memory function sections provided on opposite sides of the gate electrode and having a function of retaining charges.

30 Claims, 26 Drawing Sheets

FIG.2
(a)
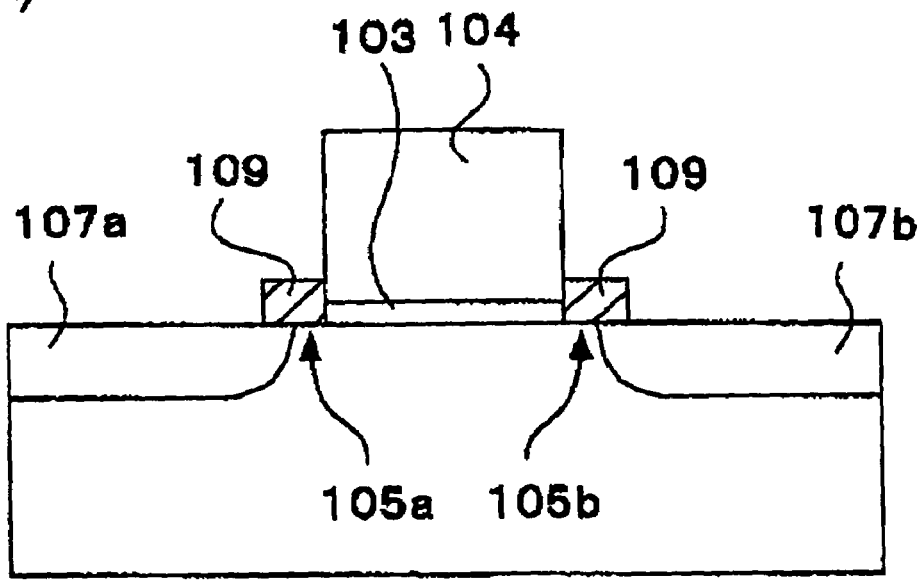
(b)
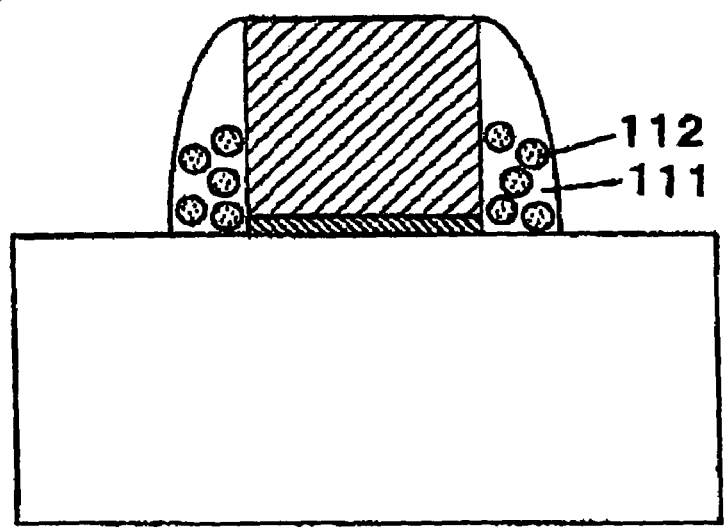

FIG.25 "Conventional Art"
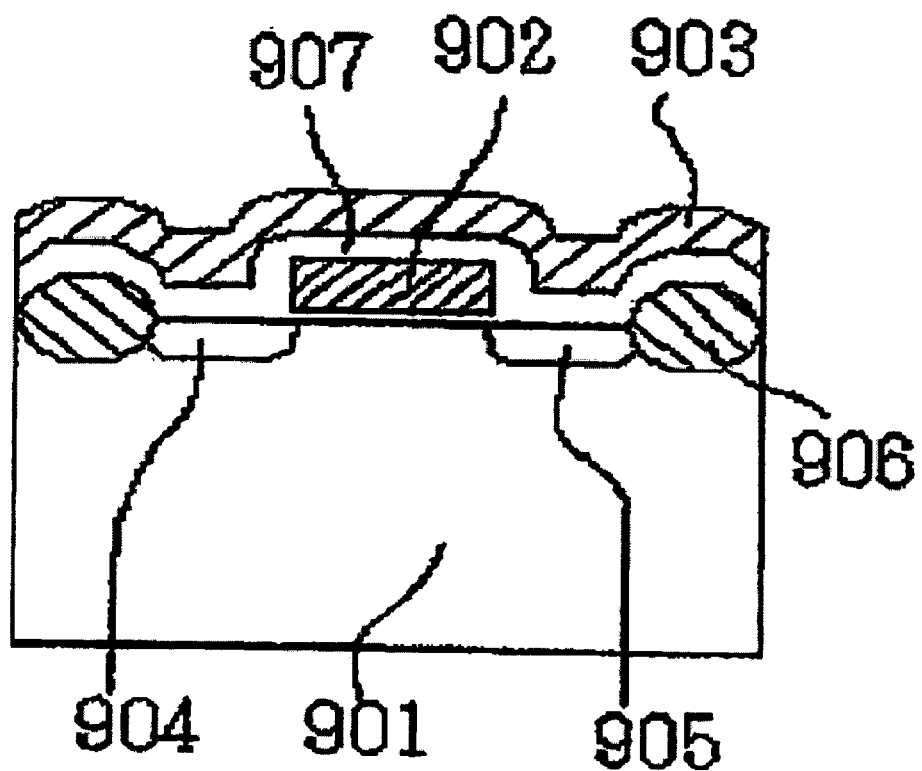

FIG.26 "Conventional Art"
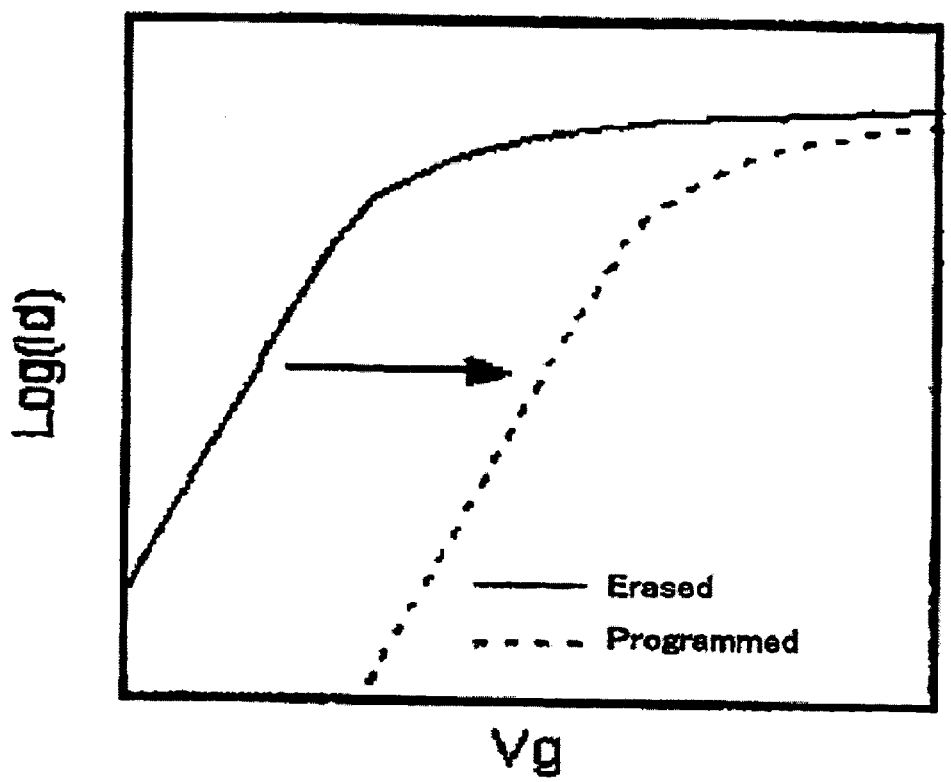

SEMICONDUCTOR STORAGE DEVICE, MOBILE ELECTRONIC APPARATUS, AND METHOD FOR CONTROLLING THE SEMICONDUCTOR STORAGE DEVICE

This non-provisional application claims priority under 35 U.S.C. §119(a) on Patent Application No. 2003-142541 filed in Japan on May 20, 2003, the entire contents of which are hereby incorporated by reference.

BACKGROUND OF THE INVENTION

1. Field of the Invention

The present invention relates to a semiconductor storage device, a mobile electronic apparatus, and a method for controlling the semiconductor storage device.

2. Description of the Related Art

One representative type of conventional is non-volatile memory is the flash memory.

In the flash memory, as shown in FIG. 25, a floating gate 902, an insulating film 907, and a word line (control gate) 903 are provided via a gate insulating film on a semiconductor substrate 901 in this order, and a source line 904 and a bit line 905, which are diffusion regions, are provided on opposite sides of the floating gate 902, constituting a memory cell. The memory cell is surrounded by an isolation region 906 (e.g., Japanese Laid-Open Publication No. 5-304277).

The memory cell holds data depending on the more or less of the amount of charge in the floating gate 902. A plurality of memory cells are arranged into a memory cell array. In the memory array, data is rewritten into or read from a desired memory cell by applying a prescribed voltage thereto via a particular word line and bit line selected.

Such a flash memory has drain current (Id) vs. gate voltage (Vg) characteristics as shown in FIG. 26 when the charge amount of the floating gate is changed. When the amount of negative charge in the floating gate is increased, the threshold is increased and the Id-Vg curve is substantially translated in a direction such that Vg is increased.

However, in this flash memory, the insulating film 907 is functionally required to separate the floating gate 902 from the word line 903. In addition, it is difficult to obtain a thin gate insulating film, because the thinner film is likely to cause charge leakage from the floating gate 902. Therefore, it is difficult to practically obtain a thin insulating film 907 and a thin gate insulating film, which is an obstacle to the miniaturization of memory cells.

SUMMARY OF THE INVENTION

According to an aspect of the present invention, a semiconductor storage device is provided, which comprises: a memory array comprising a plurality of memory elements; a write state machine for applying a first voltage for performing a write operation or an erase operation, with respect to one of the plurality of memory elements, to the one memory element via a bit line connected thereto, and thereafter, applying a second voltage for verifying is whether or not the write operation or the erase operation has been performed, with respect to the one memory element, to the one memory element via the bit line connected thereto and a reset portion for grounding the bit line connected to the one memory element after the write state machine has applied the first voltage and before the write state machine has applied the second voltage. Each of the plurality of memory elements comprises a gate electrode provided via a gate insulating film on a semiconductor layer, a channel region provided under the gate electrode, diffusion regions provided on opposite sides of the channel region and having a conductivity type opposite to that of the channel region, and memory function sections provided on opposite sides of the gate electrode and having a function of retaining charges.

In one embodiment of this invention, in each of the plurality of memory elements, one of the diffusion regions is connected to a corresponding one of a plurality of bit lines. The semiconductor storage device further comprises a column selector for selecting one of the plurality of bit lines.

In one embodiment of this invention, the column selector comprises: a first selection transistor comprising a gate, a source, and a drain, the drain being connected to one of the plurality of bit lines; and a second selection transistor comprising a gate, a source, the source being connected to the reset portion, and a drain, the drain being connected to the source of the first selection transistor. The first selection transistor and the second selection transistor are switched in accordance with a signal input to the gate of the first selection transistor and the gate of the second selection transistor to connect one of the a plurality of bit lines with the reset portion.

In one embodiment of this invention, the semiconductor storage device further comprises a pull-up portion for applying a rewrite voltage to one of the plurality of bit lines.

In one embodiment of this invention, the pull-up portion comprises: a first pull-up transistor comprising a gate, a source, and a drain, wherein a rewrite signal is input to the gate and the rewrite voltage is applied to the drain; a second pull-up transistor comprising a gate, a source, and a drain, wherein the rewrite signal is input to the gate, the source is connected to the reset portion, and the drain is connected to the source of the first pull-up transistor; and a third pull-up transistor comprising a gate, a source, and a drain, wherein a is proscribed voltage is applied to the gate, a prescribed voltage is applied to the source, and the drain is connected to the source of the first pull-up translator.

In one embodiment of this invention, the reset portion comprises a reset transistor comprising a gate, a source, and a drain, wherein the gate receives a reset signal output from the write state machine, the source is connected to ground, and the drain is connected to at least one of the plurality of bit lines.

In one embodiment of this invention, the write state machine outputs the rewrite signal to the first pull-up translator to apply a rewrite voltage to a bit line corresponding to the one memory element and a voltage to the gate electrode of the one memory element.

In one embodiment of this invention, the write state machine outputs the reset signal for about 0.5 microseconds after outputting the rewrite signal.

In one embodiment of this Invention, the write state machine verifies whether or not a write operation or an erase operation has been performed with respect to the one memory element by applying a second voltage to the drain electrode of the one memory element after outputting the reset signal.

In one embodiment of this invention, the second voltage is about one volt.

In one embodiment of this invention, the memory function section of each of the plurality of memory elements comprises a charge retaining film having a function of retaining charges, and the charge retaining film extends substantially parallel to a side of the gate electrode.

In one embodiment of this invention, the semiconductor layer of each of the plurality of memory elements has a region in a vicinity of the diffusion region, the region having a concentration higher than that of a vicinity of a surface of the semiconductor layer-under the gate electrode.

According to another aspect of the present invention, a mobile electronic apparatus is provided, which comprises the above-described semiconductor storage device.

According to another aspect of the present invention, a method for controlling a semiconductor storage device comprising a plurality of memory elements is provided, which comprises the steps of: applying a first voltage for performing a write operation or an erase operation, with respect to one of the plurality of memory elements, to the one memory element via a bit line connected thereto; grounding, after the first voltage applying step, the bit line connected to the one memory elements and applying, after the grounding step, a second voltage for verifying whether or not the write operation or the erase operation has been performed, with respect to the one memory element, to the one memory element via the bit line connected thereto. Each of the plurality of memory elements comprises a gate electrode provided via a gate insulating film on a semiconductor layer, a channel region provided under the gate electrode, diffusion regions provided on opposite sides of the channel region and having a conductivity type opposite to that of the channel region, and memory function sections provided on opposite sides of the gate electrode and having a function of retaining charges.

In one embodiment of this invention, the stop of applying the first voltage for performing a write operation or an erase operation comprises the step of applying a voltage for performing the write operation.

In one embodiment of this invention, the step of is applying the first voltage for performing a write operation or an erase operation comprises the step of applying a voltage for performing the erase operation.

The reset portion discharges (resets) a bit line connected to a memory element by grounding. Specifically, the reset portion grounds a bit line connected to a memory element when the reset portion is enabled. The reset portion does not ground the bit line when the react portion is disabled. Therefore, the reset portion is connected to a bit line connected to a memory element and is also connected to ground.

Procedures for performing a write operation with respect to a memory element and verifying the write operation according to the present invention will be described below.

A voltage is applied to the drain of a memory element via a bit line, another voltage to applied to the gate of the memory element via a word line, and the source of the memory element is grounded. After such a write operation has been performed with respect to the memory element, the application of these voltages is disabled and the drain of the memory element is grounded. Thereafter, grounding of the drain of the memory element is disabled. Finally, the write operation with respect to the memory element is verified.

Procedures for performing an erase operation with respect to a memory element and verifying the erase operation according to the present invention will be described below.

A voltage is applied to the source of a memory element via a bit line, another voltage is applied to the gate of the memory element via a word line, and the drain of the memory element is floated. After such an erase operation has been performed with respect to the memory element, the application of the voltage to the source of the memory element is disabled and the application of the other voltage to the gate of the memory element is disabled, so that the source of the memory element is grounded and the drain of the memory element is grounded. Thereafter, grounding of the drain of the memory element is disabled. Finally, the erase operation with respect to the memory element is verified.

The mobile electronic apparatus of the present invention comprises the semiconductor storage device of the present invention, and therefore, has at least the same effect as that of the semiconductor storage device of the present invention.

Thus, the invention described herein makes possible the advantages of providing a semiconductor storage device and a mobile electronic apparatus, which can be easily miniaturized and in which a time between the end of a rewrite operation with respect to a memory element (including a write operation and an erase operation) and the beginning of a verify operation of the rewrite operation is reduced; and a circuit for discharging a bit line connected to a memory element.

These and other advantages of the present invention will become apparent to those skilled in the art upon reading and understanding the following detailed description with reference to the accompanying figures.

BRIEF DESCRIPTION OF THE DRAWINGS

FIG. 2 is a schematic cross-sectional view showing a variation of a memory element of the semiconductor storage device according to Embodiment 1 of the present invention.

FIG. 25 is a schematic cross-sectional view showing a conventional flash memory.

FIG. 26 is a graph showing electric characteristics of a conventional flash memory.

DESCRIPTION OF THE PREFERRED EMBODIMENTS

Figure 1:
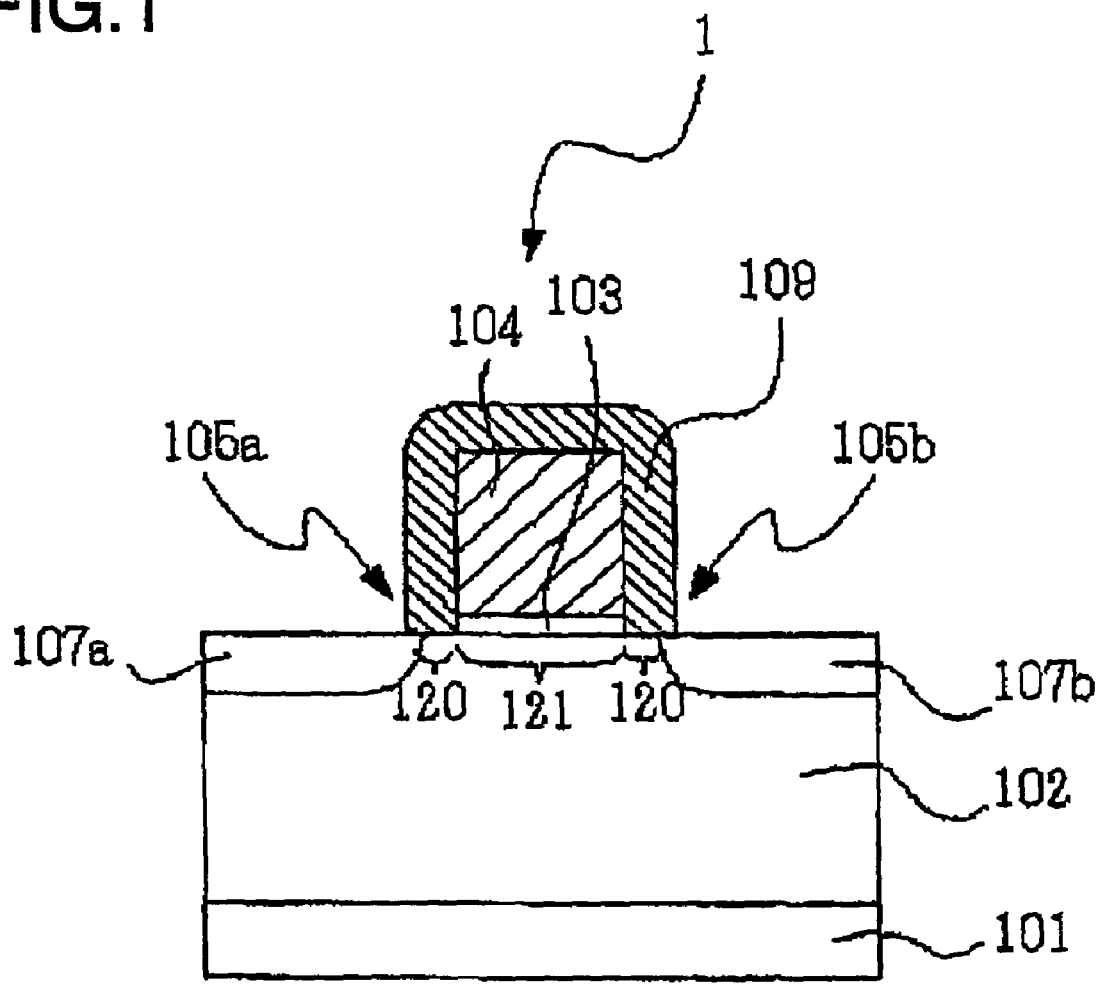
FIG. 1 is a schematic cross-sectional view showing a memory element of a semiconductor storage device according to Embodiment 1 of the present invention.

Hereinafter, the present invention will be described by way of illustrative embodiments with reference to the accompanying drawings. The present invention is not limited to the drawings. In the drawings, like reference numerals refer to like elements.

The semiconductor storage device of the present invention comprises at least one memory element.

The semiconductor storage device of the present invention mainly comprises a memory element and an amplifier.

The memory element mainly comprises a semiconductor layer, a gate insulating film, a gate electrode, a channel region, a diffusion region, and a memory function section. As used herein, the term "channel region" refers to a region which typically has the same conductivity type as that of the semiconductor layer and is located directly under the gate electrode. As used herein, the term "diffusion region" refers to a region which has a conductivity type opposite to that of the channel region.

Specifically, the memory element of the present invention may comprise a first conductivity type region as a diffusion region, a second conductivity type region as a channel region, a memory function section extending across a border between the first and second conductivity type region, and an electrode provided via a gate insulating film. Preferably, the memory element of the present invention may comprise a gate electrode provided on a gate insulating film, two memory function sections provided on opposite sides of the gate electrode, two diffusion regions each provided on a side of the memory function section opposite to the gate electrode, and a channel region provided under the gate electrode.

The semiconductor apparatus of the present invention is provided as semiconductor layers on a semiconductor substrate, and preferably, on a first conductivity type well region provided within the semiconductor substrate.

The semiconductor substrate is not particularly limited as long as it can be used in semiconductor apparatuses. Examples of the semiconductor substrate include bulk substrates made of, for example, an elemental semiconductor, such as silicon, germanium, or the like, or a compound semiconductor, such as silicon germanium, GaAs, InGaAs, ZnSe, GaN, or the like. Substrates having a semiconductor layer on a surface thereof may be used, including SOI (Silicon on Insulator) substrates, SOS substrates, multilayer SOI substrates, glass or plastic substrates having a semiconductor layer, and the like. Particularly, a silicon substrate or an SOI substrate having a silicon layer on a surface thereof are preferable. The semiconductor substrate or the semiconductor layer may be monoscrystalline (e.g., using epitaxy), polycrystalline, or amorphous, depending on which the amount of current passing therewithin varies.

Preferably, an isolation region is provided on the semiconductor layer. In addition, an element, such as a transistor, a capacitor, a resistor, or the like, may be provided on the semiconductor layer. These elements may be combined into a circuit or a semiconductor apparatus. The circuit or semiconductor apparatus may have a single layer structure, or a multilayer structure with interlayer insulating film(s). The isolation region may be made of an isolation film, such as a LOCOS film, a trench oxide film, an STI film, or the like. The semiconductor layer may have P-type or N-type conductivity. Preferably, at least one first conductivity type (P-type or N-type) well region is provided on the semiconductor layer. The impurity concentrations of the semiconductor layer and the well region may be within a range known in the art. Note that when an SOI substrate is used as the semiconductor layer, a well region may be provided in a surface is semiconductor layer, while a body region may be provided under a channel region.

The gate insulating film 18 not particularly limited as long as it is commonly used for semiconductor apparatuses. For example, the gate insulating film may be a single-layer or multilayer film of an insulating film, such as a silicon oxide film, a silicon nitride film, or the like; and a highly dielectric film, such as an aluminum oxide film, a titanium oxide film, a tantalum oxide film, a hafnium oxide film, or the like. Particularly, a silicon oxide film is preferable. The gate insulating film preferably has a film thickness of about 1 to 20 nm, and more preferably about 1 to 6 nm. The gate insulating film may be provided only directly under a gate electrode, or may be larger (wider) than the gate electrode.

The gate electrode, which is provided on the gate insulating film, is in a shape which is typically used in semiconductor apparatuses or in a shape which has a recess portion at a lower end portion thereof. Note that the gate electrode is preferably in an integrated form without being divided by a single-layer or multilayer conductive film. However, the gate electrode may be divided by a single-layer or multilayer conductive film. The gate electrode may have a side wall insulating film on a side wall thereof. The gate electrode is not particularly limited as long as it to commonly used in semiconductor apparatuses. The gate electrode may be, for example, a single-layer or multilayer conductive film made of, for example, polysilicon, a metal (e.g., copper, aluminum, etc.), a high melting point metal (e.g., tungsten, titanium, tantalum, etc.), a silicide of a high melting point metal, or the like. The gate electrode preferably has a film thickness of, for example, about 50 to 400 nm. Note that the channel region is provided under the gate electrode.

Note that, preferably, the gate electrode is provided only on a side wall of the memory function section described below, or may not overlap an upper portion of the memory function section. With this arrangement, a contact plug can be positioned closer to the gate electrode, thereby facilitating the miniaturization of the memory element. In addition, the above-described simple arrangement facilitates the manufacture of the memory element, resulting in an improvement in yield.

The memory function section has at least a function of retaining charge (hereinafter referred to as "charge retaining function"). In other words, the memory function section has a function of storing or retaining charge, trapping charge, or retaining a charge polarization state. This function is achieved by a particular film or region having a charge retaining function, which is contained in the memory function section. Such a film or region comprises silicon nitride, silicon, silicate glass containing an impurity (e.g., phosphor, boron, etc.), silicon carbide, alumina, a high dielectric (e.g., hafnium oxide, zirconium oxide, tantalum oxide, etc.), zinc oxide, a ferroelectric, a metal, or the like. Therefore, the memory function section may comprise a single-layer or multilayer structure of, for example, an insulating film comprising a silicon nitride film; an insulating film comprising a conductive film or a semiconductor layer therewithin; an insulating film comprising at least one conductor or semiconductor dot; an insulating film comprising a ferroelectric film in which inner charge is polarized due to an electric field and the polarization is maintained or the like. Particularly, silicon nitride film is preferable. This is because silicon nitride film has the following benefits: 1) silicon nitride film has a high trap level of charges, and therefore., can have large hysteresis characteristics; 2) silicon nitride film also has a long charge retaining time, so that there is substantially no charge leakage due to generation of a leak path, and therefore, the charge retaining function is satisfactory; and 3) silicon nitride film is a standard material for the manufacture of LSIs.

When an insulating film comprising therewithin a film having a charge retaining function, such as a silicon nitride film or the like, to used as a memory function section, the reliability of retaining memories can be enhanced. Since silicon nitride film is an insulating material, even if charge leakage occurs in a portion of the film, all charges cannot be immediately eliminated throughout the silicon nitride film. When a plurality of memory elements are arranged, a distance between memory elements may be small, and thereby, some adjacent memory function sections may contact each other. In this case, if the memory function sections are made of a conductor, information stored in the memory function sections can be lost. However, the insulating film memory function section can avoid such a problem. In addition, a contact plug can be positioned closer to the memory function section. In some cases, the contact plug can overlap the memory function section. Therefore, the miniaturization of the memory element can be facilitated.

In order to enhance the reliability of retaining memories, a film-like shape is not necessarily required for a film having a charge retaining function. It is preferable that a film having a charge retaining function is discretely provided in an insulating film. Specifically, a film having a charge retaining function is preferably distributed in the form of dote in a material which resists retaining a charge, such as silicon oxide or the like.

When a conductive film or a semiconductor layer is used as a charge retaining film, the charge retaining film is preferably provided via an insulating film so that the charge retaining film does not directly contact a semiconductor layer (a semiconductor substrate, a well region, a body region, a source/drain region, or a diffusion region) or a gate electrode. For example, conductive films and insulating films are alternately stacked (multilayer structure); a conductive film is distributed in the form of dots in an insulating film; a conductive film is provided in a portion of a side wall insulating film provided on a side wall of a gate; and the like.

Preferably, by employing as a memory function section an insulating film comprising a conductive film or a semiconductor layer therewithin, the amount of charges to be injected into the conductor or semiconductor film can be controlled substantially freely, thereby obtaining a multivalued memory function section.

Preferably, by employing as a memory function section an insulating film comprising at least one conductor or semiconductor dot, write/erase operation due to direct tunneling of charge can be facilitated, resulting in lower power consumption.

A ferroelectric film, such as PZT, PLZT, or the like, in which a polarization direction varies depending on electric field, may be used as a memory function section. In this case, charges are substantially generated on a surface of a ferroelectric film due to polarization, and such a state is maintained. Therefore, the ferroelectric film memory function section, can have hysteresis characteristics similar to that of a film having a memory is function, such that charges are supplied from the outside of the film and are then trapped by the film. In addition, the ferroelectric film can retain charges without injection of charges from the outside of the film. In the ferroelectric film, hysteresis characteristics can be obtained only due to the polarization of charges within the film. Therefore, the ferroelectric film can preferably provide high-speed write/erase operation.

Note that the insulating film contained in the memory function section is preferably a film which has a region or function of obstructing escaping charges. An exemplary film having a function of obstructing escaping charges it a silicon oxide film or the like.

The charge retaining film contained in the memory function section is provided on opposite sides of the gate electrode directly or via an insulating film, or is provided on a semiconductor layer (a semiconductor substrate, a well region, a body region, or a source/drain region or a diffusion region) directly or via a gate insulating film. The charge retaining film on the opposite sides of the gate electrode preferably overlap the entire or a part of the side wall of the gate electrode directly or via an insulating film. In an exemplary application in which the gate electrode has a recess portion in a lower end portion thereof, the charge retaining film may be formed directly or via an insulating film to bury the recess portion completely or partially.

The diffusion region can function as a source/drain region, and has a conductivity type opposite to that of the semiconductor layer or the well region. The junction between the diffusion region and the semiconductor layer or the well region preferably has a steep gradient of impurity concentration this is because hot electrons or hot holes are efficiently generated at a lower voltage, i.e., a high-speed operation can be achieved at a low voltage. The junction depth of the diffusion region is not particularly limited, and can be adjusted as appropriate, depending on the desired function of a semiconductor storage device or the like. Note that when an SOI substrate is used as a semiconductor substrate, the diffusion region may have a junction depth smaller than a film thickness of the surface semiconductor layer. Preferably, the junction depth is approximately equal to the film thickness of the surface semiconductor layer.

The diffusion region may be disposed to overlap an end of the gate electrode, to be contiguous to an end of the gate electrode, or to be offset from an end of the gate electrode. Particularly when the diffusion region is offset from an end of the gate electrode, the inversion of an offset region under the charge retaining film, which is caused by applying a voltage to the gate electrode, depends largely on the amount of charges accumulated in the memory function section. Therefore, the memory effect is increased and the short channel effect is reduced. However, when the offset is large, a driving current between the diffusion regions (source/drain) is significantly reduced. Therefore, the offset, i.e., a distance from one and of the gate electrode to the nearer diffusion region in the gate longitudinal direction, is preferably shorter than a thickness of the charge retaining film in a direction parallel to the gate longitudinal direction. It is particularly important that at least a portion of a film or region in the memory function section, which has a charge retaining function, overlaps a portion of the diffusion region. The essence of the memory element contained in the semiconductor storage device of the present invention to that a memory is rewritten by an electric field across the memory function section generated by a voltage difference between the gate electrode present only on the side wall portion of the memory function section, and the diffusion region.

A portion of the diffusion region may be provided above a surface of the channel region, i.e., a lower surface of the gate insulating film. In this case, it is appropriate that a conductive film is formed on the diffusion region provided in the semiconductor substrate in a manner that integrates the conductive film with the diffusion region. Examples of such a conductive film include a semiconductor (e.g., polysilicon, amorphous silicon, etc.), silicide, the above-described metals, high malting point metals, and the like. Particularly, polysilicon is preferable. Since polysilicon has a very high impurity diffusion rate as compared with that of the semiconductor layer, it is easy to obtain a shallow junction depth of the diffusion region in the semiconductor layer, i.e., it is easy to suppress the short channel effect. Note that, in this case, at least a portion of the memory function section as well as the gate electrode are preferably located between the diffusion regions.

The memory element of the present invention can be formed in a manner similar to a technique, in which a typical semiconductor process is used to form a side-wall spacer having a single-layer or multilayer structure on, for example, a side wall of the gate electrode. Specifically, after the gate electrode is formed, a single-layer film or multilayer film comprising a film having a charge retaining function (hereinafter referred to as "charge retaining film"), a charge retaining film/an insulating film, an insulating film/a charge retaining film, an insulating film/a charge retaining film/an insulating film, or the like, are formed. The resultant film subjected to etch back under appropriate conditions so as to leave a residual film in the form of a side-wall spacer. Alternatively, an insulating film or a charge retaining film is formed. Etch back is performed under appropriate conditions so that a residual film is left in the form of a side-wall spacer. Another charge retaining film or an insulating film is formed. Etch back is similarly performed so that a residual film is left in the form of a side-wall spacer. Alternatively, an insulating film material, in which particulate charge retaining materials are distributed, is applied or deposited on a semiconductor layer comprising a gate electrode. Etch back is performed under appropriate conditions so that a residual insulating film material is left in the form of a side-wall spacer. Alternatively, after a gate electrode to formed, the above-described single-layer film or multilayer film is formed. Patterning is performed using a mask. Alternatively, a charge retaining film, a charge retaining film/an insulating film, an insulating film/a charge retaining film, an insulating film/a charge retaining film/an insulating film, or the like is formed before forming a gate electrode. An opening is formed in a region which will be a channel region in these films. A gate electrode material film is formed on the entire surface of the resultant structure. The gate electrode material film is subjected to patterning in such a manner that a portion thereof, which buries the opening and has a size broader than that of the opening, is left. The present invention is not limited to these methods.

When a plurality of memory elements of the present invention are arranged into an array (memory cell array), the best mode of the memory element is obtained if all of the following requirements are satisfied for example, (1) the gate electrodes of a plurality of memory elements are integrated together to function as a word line; (2) a memory function section is provided on opposite sides of the word line; (3) an insulator, particularly a silicon nitride film, retains charges in the memory function section; (4) the memory function section is made of ONO (Oxide Nitride Oxide) film, and the silicon nitride film has a surface substantially parallel to a surface of the gate insulating film; (5) the silicon nitride film in the memory function section is separated from the word line and the channel region by the silicon oxide film; (6) the insulating film (silicon nitride film) in the memory function section and the diffusion region overlap each other; (7) a thickness of the insulating film separating the silicon nitride film having a surface substantially parallel to a surface of the gate insulating film from the channel region or the semiconductor layer, is different from a thickness of the gate insulating film; (8) writing and erasure of a single memory element are performed via a single word line; (9) no electrode (word line) having a function of aiding writing and erasure is possessed on the memory function section; and (10) a region having high impurity concentration and a conductivity type opposite to that of the diffusion region is provided directly under the memory function section and adjacent to the diffusion region. Note that a memory element which satisfies at least one of the requirements may be used herein.

A particularly preferable combination of the above-described requirements include that (3) an insulator, particularly a silicon nitride film, retains charges in the memory function section; (6) the insulating film (silicon nitride film) in the memory function section and the diffusion region overlap each other; and (9) no electrode (word line) having a function of aiding write and erase operations is possessed on the memory function section.

A memory element, which satisfies the requirements (3) and (9), is considerably useful as described below. A bit line contact can be disposed closer to a memory function section on a sidewall of a word line. In addition, even when memory elements are close to each other, a plurality of memory function sections do not interfere with each other, thereby retaining memory information. Therefore, the miniaturization of memory elements is facilitated. Note that when the charge retaining region in the memory function section is made of a conductor, charge retaining regions interfere with each other due to capacity coupling as memory elements are disposed closer to each other, whereby memory information cannot be retained.

When the charge retaining region in the memory function section is made of an insulator (e.g., a silicon nitride film, etc.), It is not necessary that a separate memory function section is provided in each memory cell. For example, memory function sections, which are provided on opposite sides of a word line shared by a plurality of memory cells, need not be separated from each other in each memory cell. The memory function sections provided on the opposite sides of the word line can be shared by the plurality of memory cells sharing the word line. Therefore, a photolithography step and an etching step for separation of memory function sections are not required, thereby simplifying manufacturing processes. In addition, a positioning margin in a photolithography step and a margin for film reduction by etching are not required, thereby making it possible to reduce a margin between memory cells. Therefore, as compared with when the charge retaining region in the memory function section is made of a conductor (e.g., polycrystalline silicon film), the footprint of a memory cell can be reduced even if the same level of micromachining is used. Note that when the charge retaining region in the memory function section is made of a conductor, a photolithography stop and an etching step for separating memory function sections for each memory cell are required. In this case, a photolithography positioning margin and an etching film reduction margin are required.

In addition, no electrode having a function of aiding write and erase operations is provided on the memory function section, and therefore, the device structure is simple, whereby the number of steps can be reduced and the yield can be improved. Therefore, it is possible to integrate the memory element of the present invention with transistors constituting a logic circuit or an analog circuit. Moreover, inexpensive semiconductor storage devices can be obtained.

It is more preferable that the requirement (6) as well as the requirements (3) and (9) are satisfied. Specifically, when a charge retaining region in a memory function section and a diffusion region overlap each other, write and erase operations can be performed at a considerably lower voltage. Specifically, for example, write and erase operations can be performed at such low a voltage as 5 V or less. This is a considerably large effect in terms of circuit design. A high voltage, which is required for flash memories, is not required in a chip. Therefore, a charge pumping circuit, which requires a large footprint, can be omitted or its size can be reduced. Particularly, when a small-capacity memory is incorporated for adjustment into a logic LSI, the footprint of peripheral circuitry for driving the memory cell is dominant in the memory portion as compared with the footprint of the memory cell. Therefore, by omitting a voltage boostering circuit for a memory cell or reducing the size thereof, the size of a chip can be most effectively reduced.

When the requirement (3) is not satisfied, i.e., a conductor is used to retain charges in the memory function section, a write operation can be performed even if the requirement (6) is not satisfied, i.e., the conductor in the memory function section and a diffusion region do not overlap each other. This is because the conductor in the memory function section aids writing due to capacity coupling with the gate electrode.

When the requirement (9) is not satisfied, i.e., an electrode having a function of aiding write and erase operations is provided on the memory function section, writing can be performed even if the requirement (6) is not satisfied, i.e., an insulator in the memory function section and a diffusion region do not overlap each other.

In the semiconductor storage device of the present Invention one or both ends of the memory element may be connected to a transistor in series, or alternatively, the memory element and a logic transistor may be integrated together on the same chip. In this case, the semiconductor device of the present invention, particularly the memory element, can be formed by a process having high affinity to a standard process for typical transistors (e.g., transistors, logic translators, etc.). Therefore, the memory element and transistors can be simultaneously formed. Therefore, a process for integrating the memory element with a transistor or a logic transistor is simple, thereby making it possible to obtain an inexpensive integrated device.

In the semiconductor storage device of the present invention, one memory function section can store two or more-level information, whereby the memory element can store 4 or more-level information. Note that the memory element may store only two-level information. In addition, when the variable resistor effect of the memory function section is utilized, the memory element can function as a memory cell having functions of both a selection translator and a memory translator.

The semiconductor storage device of the present invention may be combined with a logic element, a logic circuit, or the like to provide a wide variety of applications of electronic apparatuses, such as data processing systems (e.g., personal computers, notebook computers, laptop computers, personal assistant/signal emitters, minicomputers, workstations, mainframes, multiprocessor computers or all other types of computer systems); electronic parts contained in data processing systems (e.g., CPUs, memories, data storage devices, etc.); communication apparatuses (e.g., telephones, PHS, modems, rooters, etc.); Image display apparatuses (e.g., display panels, projectors, etc.); business machines (e.g., printers, scanners, copying machines, etc.); video apparatuses (e.g., video cameras, digital cameras, etc.); entertainment apparatuses (e.g., game machines, music players, etc.); information apparatuses (e.g., personal digital assistants, clocks and watches, electronic dictionaries, etc.); apparatuses carried on cars (e.g., car navigation systems, car audio apparatuses, etc.); audio/video apparatuses for recording/reproducing information, such as moving images, static images, music, and the like; electrical appliances (e.g., washing machines, microwave ovens, refrigerators, rice cookers, dishwashers vacuum cleaners, air conditioners, etc.); health care apparatuses (e.g., massaging machines, scales, sphygmomanometers, etc.); mobile storage devices (e.g., IC cards, memory cards, etc.); or the like. Particularly, the semiconductor storage device of the present invention is useful for mobile electronic apparatuses, such as mobile telephones, mobile information terminals IC cards, memory cards, mobile computers, mobile game machines, digital cameras, portable video players, portable music players, electronic dictionaries, clocks and watches, and the like. Note that the semiconductor storage device of the present invention may be incorporated as at least a portion of a control circuit or a data storage circuit of an electronic apparatus, or may be optionally incorporated in a detachable manner.

A method for producing the above-described memory element will be described below with reference to FIG. 8. A gate insulating film 214 and a gate electrode 217 are formed on a semiconductor substrate 211 using known procedures. Thereafter, a silicon oxide film 241 having a film thickness of 0.8 to 20 nm, more preferably 3 to 10 nm, is formed using a thermal oxidation method or is deposited using a CVD (Chemical Vapor Deposition) method on an entire surface of the semiconductor substrate 211. Next, a silicon nitride film 242 having a film thickness of 2 to 15 nm, more preferably 3 to 10 nm, is deposited on an entire surface of the silicon oxide film 241 using the CVD method. Further, a silicon oxide film 243 having a thickness of 20 to 70 nm is deposited on an entire surface of the resultant structure using the CVD method.

Thereafter, the silicon oxide film/silicon nitride film/ silicon oxide film is etched back by anisotropic etching. As a result, memory function sections 261 and 262, which are optimal to storage, are formed in the form of a side-wall spacer on side walls of the gate electrode 217.

Thereafter, the gate electrode 217 and the side-wall spacer memory function sections 261 and 262 are used as a mask to perform ion implantation to form diffusion layer regions (source/drain region) 212 and 213. Thereafter, silicide steps or upper wiring steps may be performed using known procedures.

Hereinafter, embodiments of a semiconductor storage device and a mobile electronic apparatus according to the present invention will be described with reference to accompanying drawings.

Embodiment 1

A semiconductor storage device according to Embodiment 1 of the present invention comprises a memory element 1 an shown in FIG. 1.

The memory element 1 comprises a semiconductor substrate 101, a P-type well region 102, a gate insulating film 103, and a gate electrode 104. The P-type well region 102 is provided on the semiconductor substrate 101. The gate electrode 104 is provided via the gate insulating film 103 on the P-type well region 102. A silicon nitride film 109 having a trap level for retaining charges (charge retaining film) is provided on an upper surface and side surfaces of the gate electrode 104. Portions of the silicon nitride film 109 on side wall portions of the gate electrode 104 are memory function portions 105a and 105b, respectively, which actually retain charges. The term "memory function portion" refers to a memory function section or a portion of the charge retaining film in which charges are actually accumulated due to a rewrite operation. N-type diffusion regions 107a and 107b, which function as a source region or a drain region, respectively, are provided on opposite sides of the gate electrode 104 and within the P-type well region 102. The diffusion regions 107a and 107b have an offset structure. Specifically, the diffusion regions 107a and 107b do not reach a region 121 under the gate electrode 104. An offset region 120 under the charge retaining film constitutes a portion of a channel region.

Note that the memory function portions 105a and 105b, which substantially retain charges, are side wall portions of the gate electrode 104. Therefore, the silicon nitride film 109 may be provided only on a region corresponding to the above-described portions ((a) of FIG. 2). The memory function portions 105a and 105b may have a structure such that conductor or semiconductor microparticles 111 having a nanometer order size are dispersed in an insulating film 112 ((b) of FIG. 2). In this case, if the size of each microparticle 111 is less than 1 nm, the quantum effect is too great for charges to tunnel to the dot. If the size of each microparticle 111 is more than 10 nm, no significant quantum effect occurs at room temperature. Therefore, a diameter of the microparticle 111 is preferably in the range of 1 nm to 10 nm. Further, the silicon nitride film 109 (charge retaining film) may be provided on the side of the gate electrode 104 in the form of a side-wall spacer ((a) of FIG. 2).

The principle of writing information into the memory element will be described with reference to FIGS. 3 and 4. It is now assumed that entire memory function sections 131a and 131b function to retain charges. The term "writing" refers to implantation of electrons into the memory function sections 131a and 131b when the memory element is of an N channel type. Hereinafter, the memory element is assumed to be of the N channel type.

Figure 3:
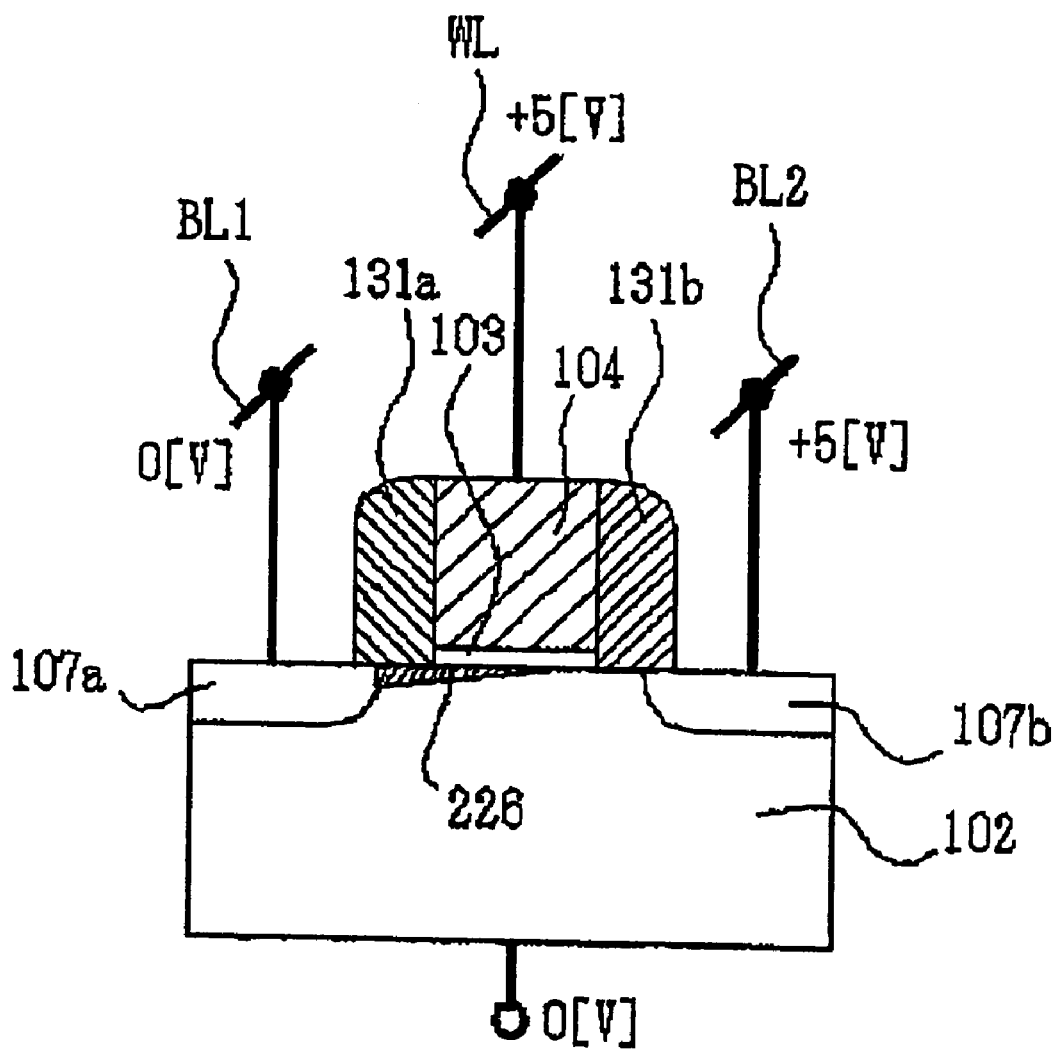
FIG. 3 is a schematic diagram for explaining a write operation of a memory element of the semiconductor storage device according to Embodiment 1 of the present invention.

To implant electrons into the second memory function section 131b (writing), as shown in FIG. 3, the N-type first diffusion region 107a is caused to function as a source electrode, while the N-type second diffusion region 107b is caused to function as a drain electrode. For example, a voltage of 0 V is applied to the first diffusion region 107a, a voltage of 0 V is applied to the P-type well region 102, a voltage of +5 V is applied to the second diffusion region 107b, and a voltage of +5 V is applied to the gate electrode 104. Under these voltage conditions, an inversion layer 226 extends from the first diffusion region 107a (source electrode), but does not reach the second diffusion region 107b (drain electrode), so that a pinch-off point occurs. Electrons are accelerated from the pinch-off point to the second diffusion region 107b (drain electrode), due to a high electronic field, to become hot electrons (highly energized conductive electrons). The hot electrons are implanted into the second memory function section 131b, resulting in writing. Note that in the vicinity of the first memory function section 131a, no hot electrons occur, i.e., writing is not performed.

Figure 4:
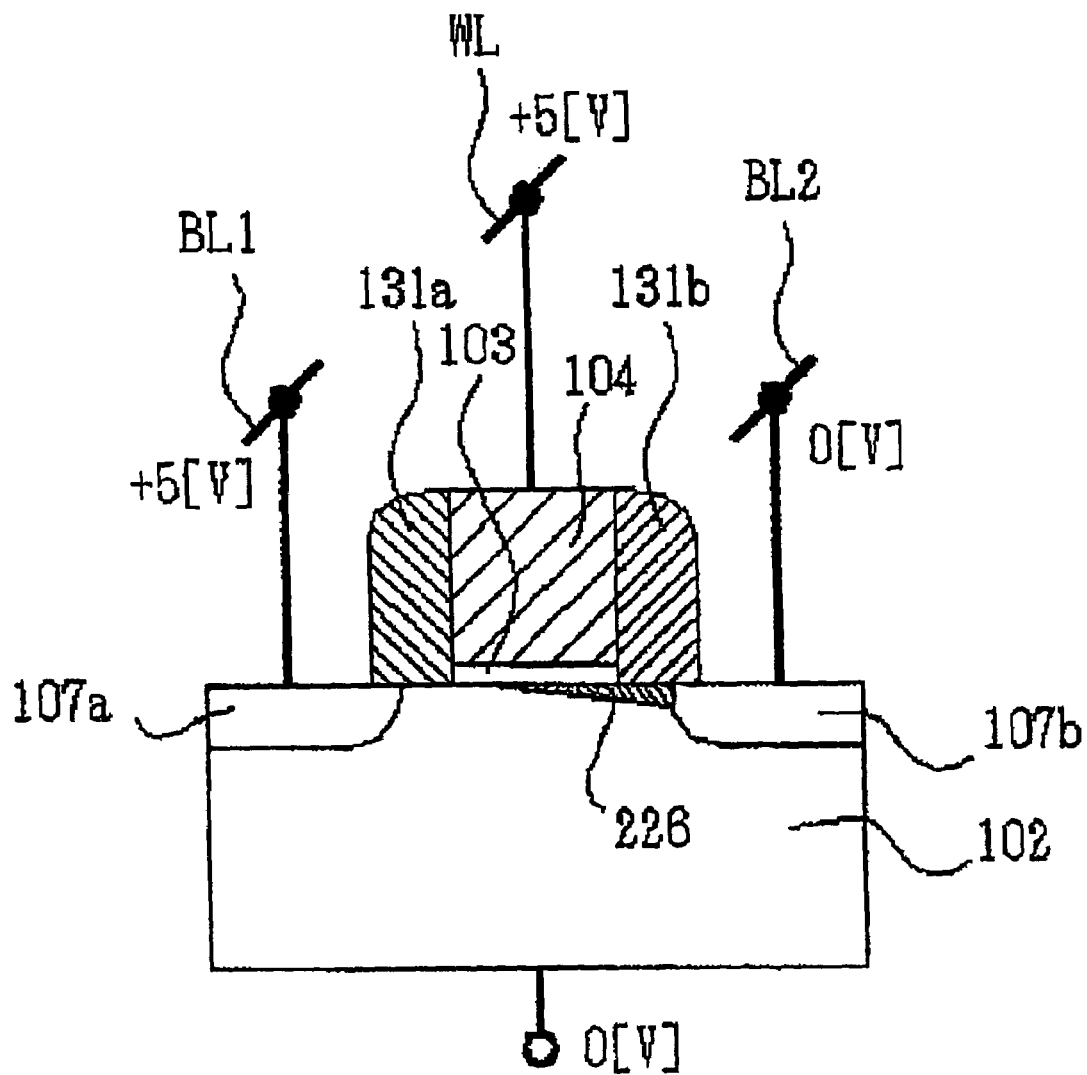
FIG. 4 is a schematic diagram for explaining a write operation of a memory element of the semiconductor storage device according to Embodiment 1 of the present invention.

To implant electrons into the first memory function section 131a (writing), as shown in FIG. 4, the second diffusion region 107b is caused to function as a source electrode, the first diffusion region 107a is caused to function as a drain electrode. For example, a voltage of 0 V is applied to the second diffusion region 107b and the P-type well region 102, a voltage of +5 V is applied to the first diffusion region 107a, and a voltage of +5 V is applied to the gate electrode 104. Thus, by implanting electrons into the first memory function section 131a instead of the second memory function section 131b (exchange of a source/drain region), writing can be performed.

Next, the principle of erasure of the memory element will be described with reference to FIGS. 5 and 6.

Figure 5:
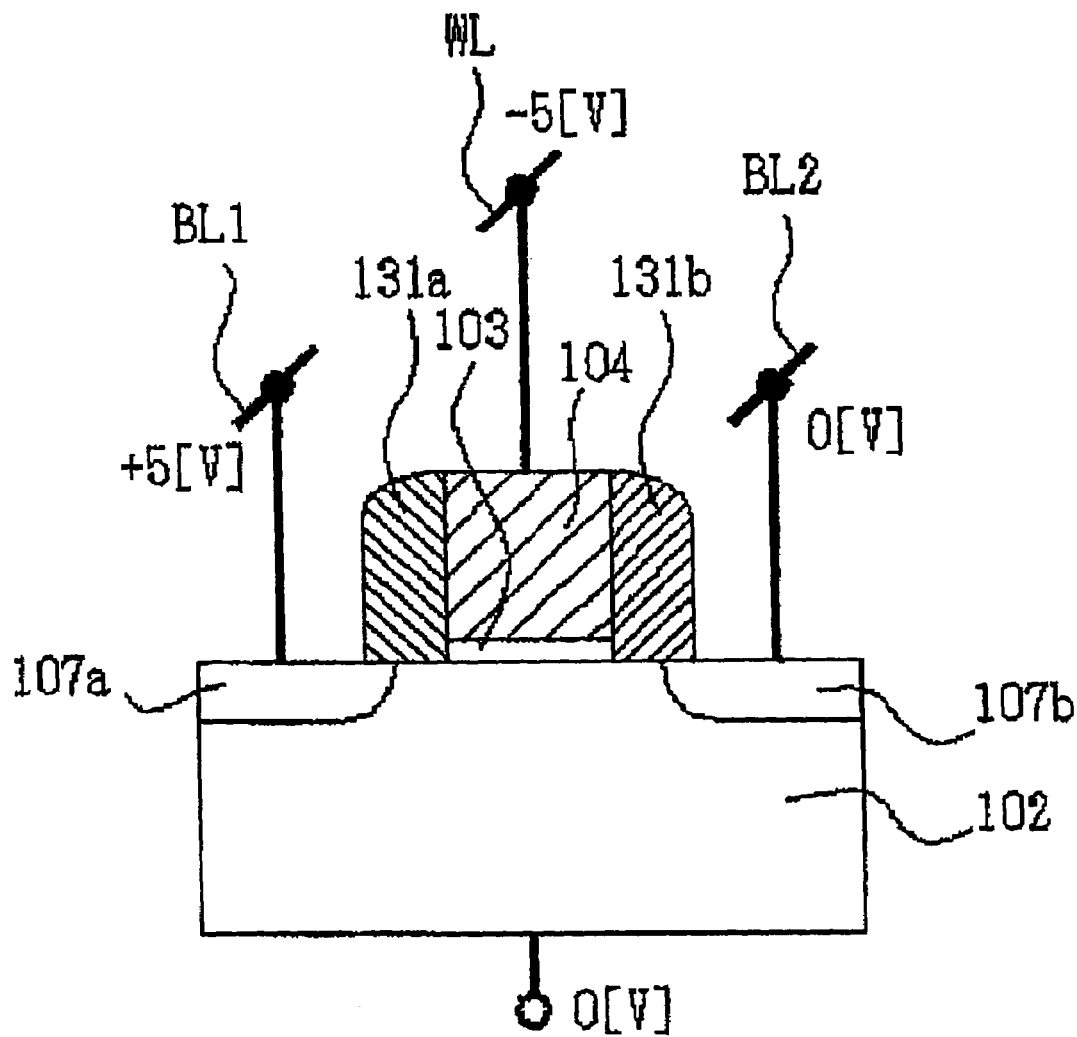
FIG. 5 is a schematic diagram for explaining an erase operation of a memory element of the semiconductor storage device according to Embodiment 1 of the present invention.

In a first method for erasing information stored in the first memory function section 131a, an shown in FIG. 5, a positive voltage (e.g., +5 V) is applied to the first diffusion region 107a, while a voltage of 0 V is applied to the P-type well region 102, so that a backward bias is applied to the PN Junction between the first diffusion region 107a and the P-type well region 102. In addition, a negative voltage (e.g., −5 V) is applied to the gate electrode 104. In this case, the potential gradient of the PN junction is particularly steep in the vicinity of the gate electrode 104 due to a negative voltage applied to the gate electrode. Therefore, due to a tunnel between bands, hot holes (highly energized holes) are generated in a portion of the PN junction closer to the P-type well region 102. The hot holes are attracted toward the gate electrode 104 having a negative potential. As a result, the holes are implanted into the first memory function section 131a. Thus, information stored in the first memory function section 131a is erased. In this case, a voltage of 0 V is applied to the second diffusion region 107b.

To erase information stored in the second memory function section 131b, the potential is exchanged between the first diffusion region and the second diffusion region.

Figure 6:
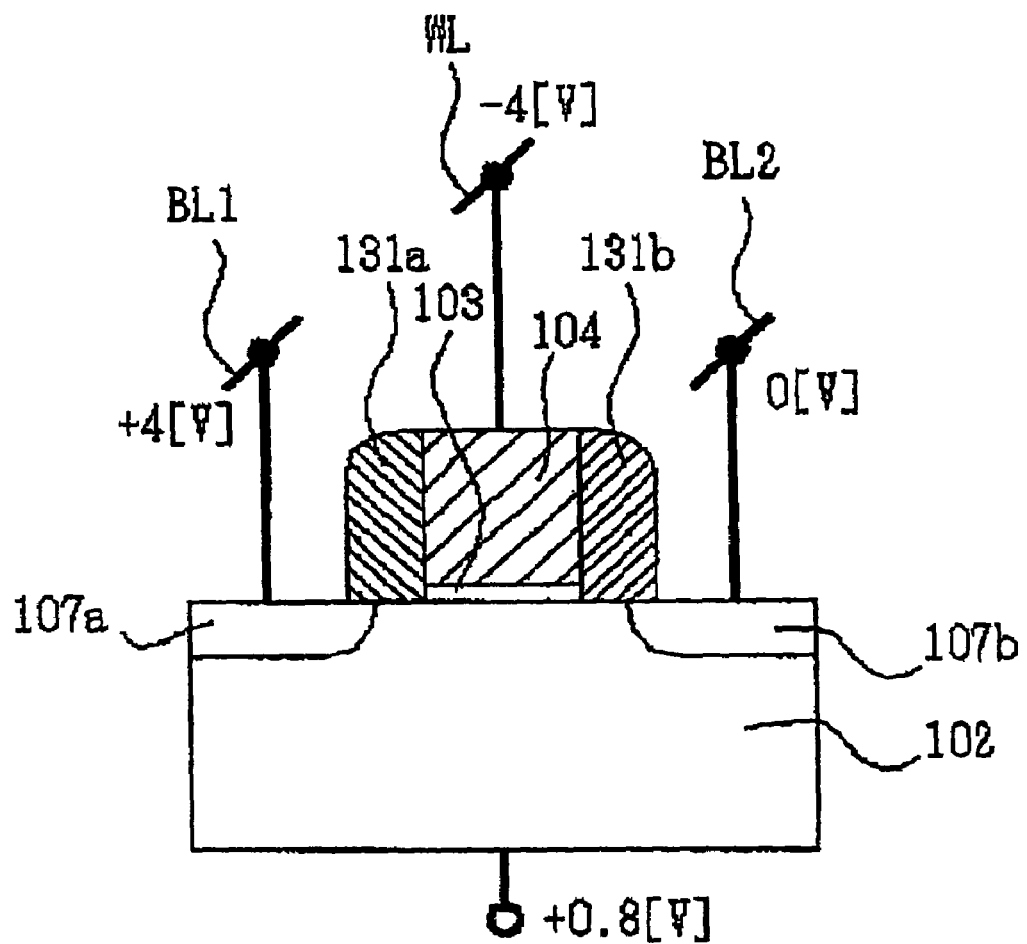
FIG. 6 is a schematic diagram for explaining an erase operation of a memory element of the semiconductor storage device according to Embodiment 1 of the present invention.

In a second method for erasing information stored in the first memory function section 131a as shown in FIG. 6, a positive voltage (e.g., +4 V) is applied to the first diffusion region 107a, a voltage of 0 V is applied to the second diffusion region 107b, a negative voltage (e.g., −4 V) is applied to the gate electrode 104, and a positive voltage (e.g., +0.8 V) is applied to the P-type well region 102. In this case, a forward voltage is applied between the P-type well region 102 and the second diffusion region 107b, so that electrons are implanted into the P-type well region 102. The implanted electrons are diffused up to the PN junction between the P-type well region 102 and the first diffusion region 107a, In which the electrons are then accelerated by strong electronic field to become hot electrons. The hot electrons generate electron-hole pairs in the PN junction. That is, by applying a forward voltage between the P-type well region 102 and the second diffusion region 107b, the electrons implanted in the P-type well region 102 trigger generation of hot holes in the other PN junction. The hot holes generated in the PN junction are attracted toward the gate electrode 104 having a negative potential. As a result, the holes are implanted into the first memory function section 131a.

In the second method, even when a voltage applied to the PN junction between the P-type well region and the first diffusion region 107a is insufficient for creating a tunnel between bands so that hot holes are not generated in the PN junction, the electrons implanted from the second diffusion region 107b trigger generation of electron-hole pairs in the PN junction, so that hot holes can be generated. Therefore, a voltage required for erasure can be lowered. Particularly, when the offset region 120 (FIG. 1) is provided, the PN junction, which is caused by the negative potential applied to the gate electrode, is not very steep. Therefore, in this case, the generation of hot holes due to a tunnel between bands is hindered. Despite this, the second method compensates for such a drawback and can perform erasure at a low voltage.

Note that in the first erasure method, information stored in the first memory function section 131a is erased by applying a voltage of +5 V to the first diffusion region 107a. In the second erasure method, only +4 V is sufficient. Thus, the second method can reduce a voltage for erasure, i.e., can reduce power consumption, thereby making it possible to suppress deterioration of the memory element due to hot carriers.

In either the first or second method, the memory element resists over-erasure. The term "over-erasure" refers to a phenomenon that as the amount of holes accumulated in the memory function section is increased, the threshold is decreased without saturation. Over-erasure raises a significant problem in EEPROM, such as representatively flash memory and the like. Particularly, when the threshold is negative, it becomes impossible to select memory cells, which is a critical operation error. On the other hand, in the memory element of the semiconductor storage device of the present invention, even when a large amount of holes are accumulated in the memory function section, electrons are induced only under the memory function section, leaving the potential of the channel region under the gate insulating film substantially unaffected. Since the erasure threshold is determined by the potential under the gate insulating film, over-erasure is unlikely to occur.

Figure 7:
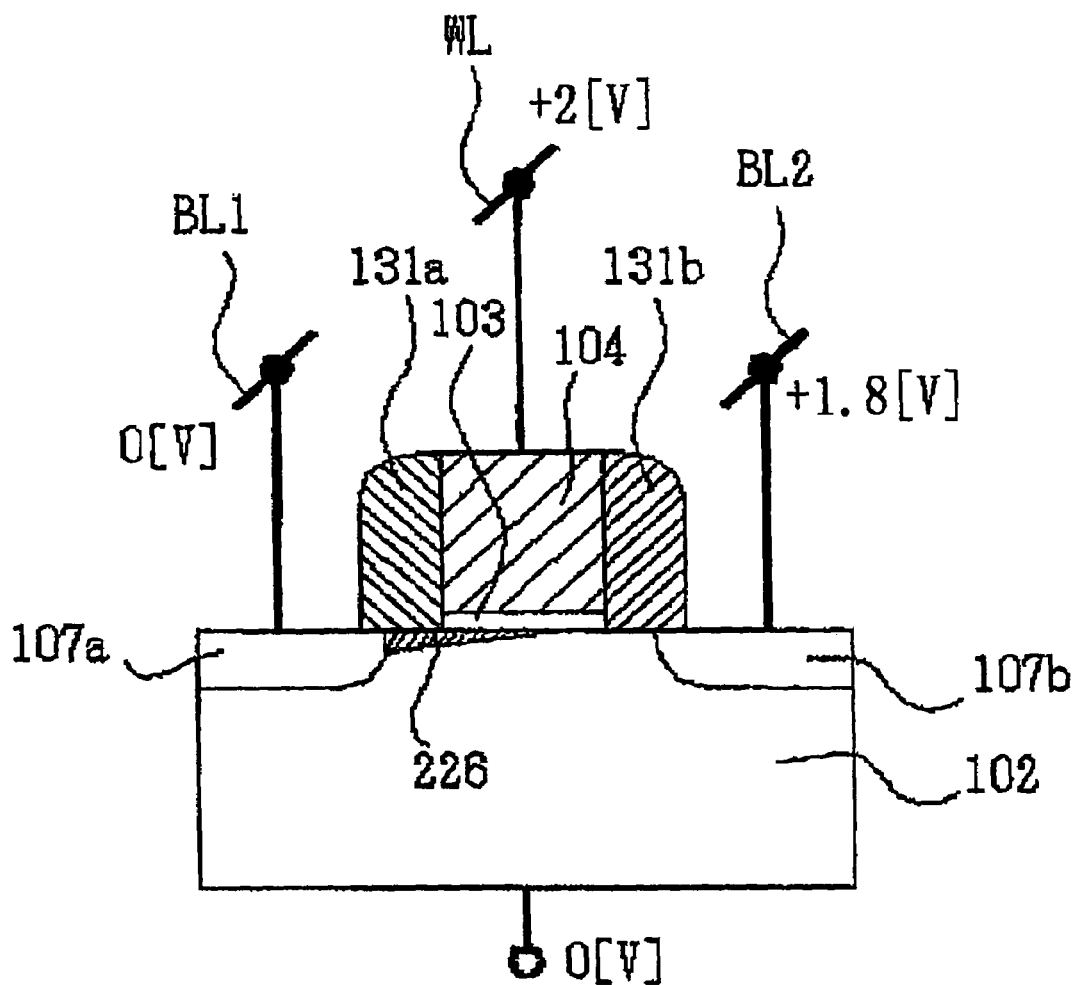
FIG. 7 is a schematic diagram for explaining a read operation of a memory element of the semiconductor storage device according to Embodiment 1 of the present invention.

A principle of a read operation of the memory element will be described with reference to FIG. 7.

To read information stored in the first memory function section 131a, the first diffusion region 107a is caused to function as a source electrode of the transistor, while the second diffusion region 107b is caused to function as a drain electrode of the transistor. For example, a voltage of 0 V is applied to the first diffusion region 107a and the P-type well region 102, a voltage of +1.8 V is applied to the second diffusion region 107b, and a voltage of +2 V is applied to the gate electrode 104. In this case, when electrons are not accumulated in the first memory function section 131a, a drain current is likely to flow. On the other hand, when electrons are accumulated in the first memory function section 131a, an inversion layer is unlikely to be formed in the vicinity of the first memory function section 131a, so that a drain current is unlikely to flow. Therefore, by detecting the drain current, it is possible to read information stored in the first memory function section 131a. Particularly when a voltage which causes a pinch-off operation is applied for a read operation, the state of charge accumulation in the first memory function section 131a can be precisely determined irrespective of the presence or absence of charge accumulation in the second memory function section 131b.

To read information stored in the second memory function section 131b, the second diffusion region 107b is caused to function as a source electrode of the transistor, while the first diffusion region 107a is caused to function as a drain electrode of the transistor. For example, a voltage of 0 V is applied to the second diffusion region 107b and the P-type well region 102, a voltage of +1.8 V is applied to the first diffusion region 107a, and a voltage of +2 V is applied to the gate electrode 104. Thus, as compared to when information stored in the first memory function section 131a is read out, by exchanging source/drain regions, information stored in the second memory function section 131b can be read out.

Note that when a portion of the channel region remains not covered with the gate electrode 104 (such a portion is the offset region 120), an inversion layer is extinguished or formed in the portion of the channel region not covered with the gate electrode 104, depending on the presence or absence of excessive charges in the memory function sections 131a and 131b. As a result, a large hysteresis (threshold change) is obtained. Note that when the width of the offset region 120 is considerably large, a drain current to significantly reduced, leading to a significant reduction in the read rate. Therefore, the width of the offset region 120 is preferably determined so as to achieve a sufficient hysteresis and read rate.

Even when the diffusion regions 107a and 107b each reach the end of the gate electrode 104, i.e., the diffusion regions 107a and 107b each overlap the gate electrode 104, the threshold of the transistor is not substantially changed by a write operation. However, a parasitic resistance at a source/drain end is significantly changed, so that a drain current is significantly reduced (by one order of magnitude or more). Therefore, it is possible to perform a read operation by detecting the drain current, thereby obtaining a function as a memory. Note that when a greater memory hysteresis effect is required, it is more preferable that the diffusion regions 107a and 107b do not overlap the gate electrode 104 (i.e., the offset region 120 exists).

With the above-described operation method, It is possible to write and erase two bite of data per transistor. In addition, memory elements may be arranged into a memory array, where a word line WL is connected to the gate electrode 104, a first bit line BL1 is connected to the first diffusion region 107a, and a second bit line BL2 is connected to the second diffusion region 107b.

In the above-described operation method, by exchanging between the source electrode and the drain electrode, writing and erasure of two bits of data per transistor is achieved. Alternatively, the source electrode and the drain electrode may be fixed so that the transistor functions as a one-bit memory. In this case, one of the source and drain regions can be caused to have a common fixed voltage, so that the number of bit lines connected to the source/drain region can be reduced by half.

As is clearly understood from the above description, in the memory element of the semiconductor storage device of the present invention, the memory function section is provided separately from the gate insulating film and is positioned on the opposite sides of the gate electrode, so that a two-bit operation can be achieved. The memory function sections are separated from each other by the gate electrode. Therefore, the interference between the memory function sections can be effectively suppressed when rewriting is performed. In addition, since the gate insulating film is separated from the memory function section, the gate insulating film can be a thin film, thereby making it possible to suppress a short, channel effect. Therefore, it is easy to miniaturize a memory element, and further, a semiconductor storage device.

Embodiment 2

Figure 8:
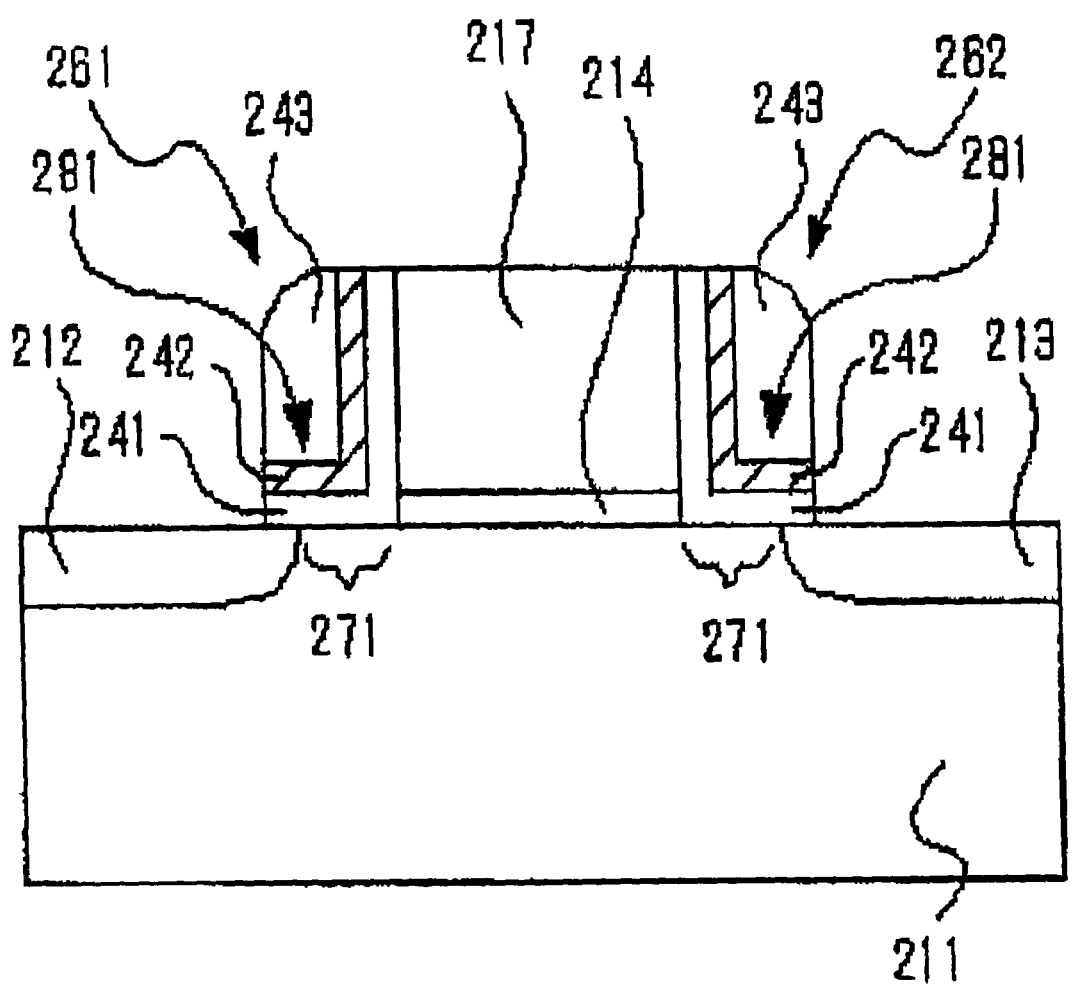
FIG. 8 to a schematic cross-sectional view showing a memory element of a semiconductor storage device according to Embodiment 2 of the present invention.

A memory element of a semiconductor storage device according to Embodiment 2 of the present invention has substantially the same structure as that of the memory element 1 of FIG. 1, except that memory function sections 261 and 262 each comprise a region for retaining charges (region for accumulating charges. e.g., a film having a function of retaining charges) and a region for obstructing escaping charges (e.g., a film having a function of obstructing escaping charges) as shown in FIG. 8.

The memory function sections 261 and 262 preferably each comprise a charge retaining film having a function of retaining charges and an insulating film for the purpose of improving the ability to retain memories. In Embodiment 2, a silicon nitride film 242 having a trap level of charges is used as a charge retaining film, while silicon oxide films 241 and 243 having a function of preventing dissipation of charges accumulated in the charge retaining film are used as insulating films. Since the memory function section comprises a charge retaining film and an insulating film, the dissipation of charges can be prevented, thereby improving the retaining ability. In addition, as compared with when a memory function section consists only of a charge retaining film, the volume of a charge retaining film can be reduced as appropriate. Thereby, the movement of charges within the charge retaining film is limited, so that the occurrence of changes in characteristics due to the movement of charges can be suppressed during the retaining of a memory. In addition, a silicon nitride film 242 is interposed between silicon oxide films 241 and 243, whereby the efficiency of charge implantation is increased during a rewrite operation so that a higher-speed operation can be obtained. Note that in this memory element, the silicon nitride film 242 may be replaced with one that is made of a ferroelectric material.

Regions (the silicon nitride film 242) of the memory function sections 261 and 262, which retain charges, overlap diffusion regions 212 and 213, respectively. In this case, the term "overlap" means that at least a portion of the region (silicon nitride film 242) for retaining charges is provided on at least a portion of the diffusion region 212 and 213. Note that reference numeral 211 indicates a semiconductor substrate, reference numeral 214 indicates a gate insulating film, reference numeral 217 indicates a gate electrode, a reference numeral 271 indicates an offset region between the gate electrode 217 and diffusion regions 212 and 213. Though not shown, a channel region is provided under the gate insulating film 214, i.e., on an uppermost surface of the semiconductor substrate 211.

An effect of overlapping of the silicon nitride film 242, which is a region for retaining charges in the memory function sections 261 and 262, and the diffusion regions 212 and 213, will be described below.

Figure 9:
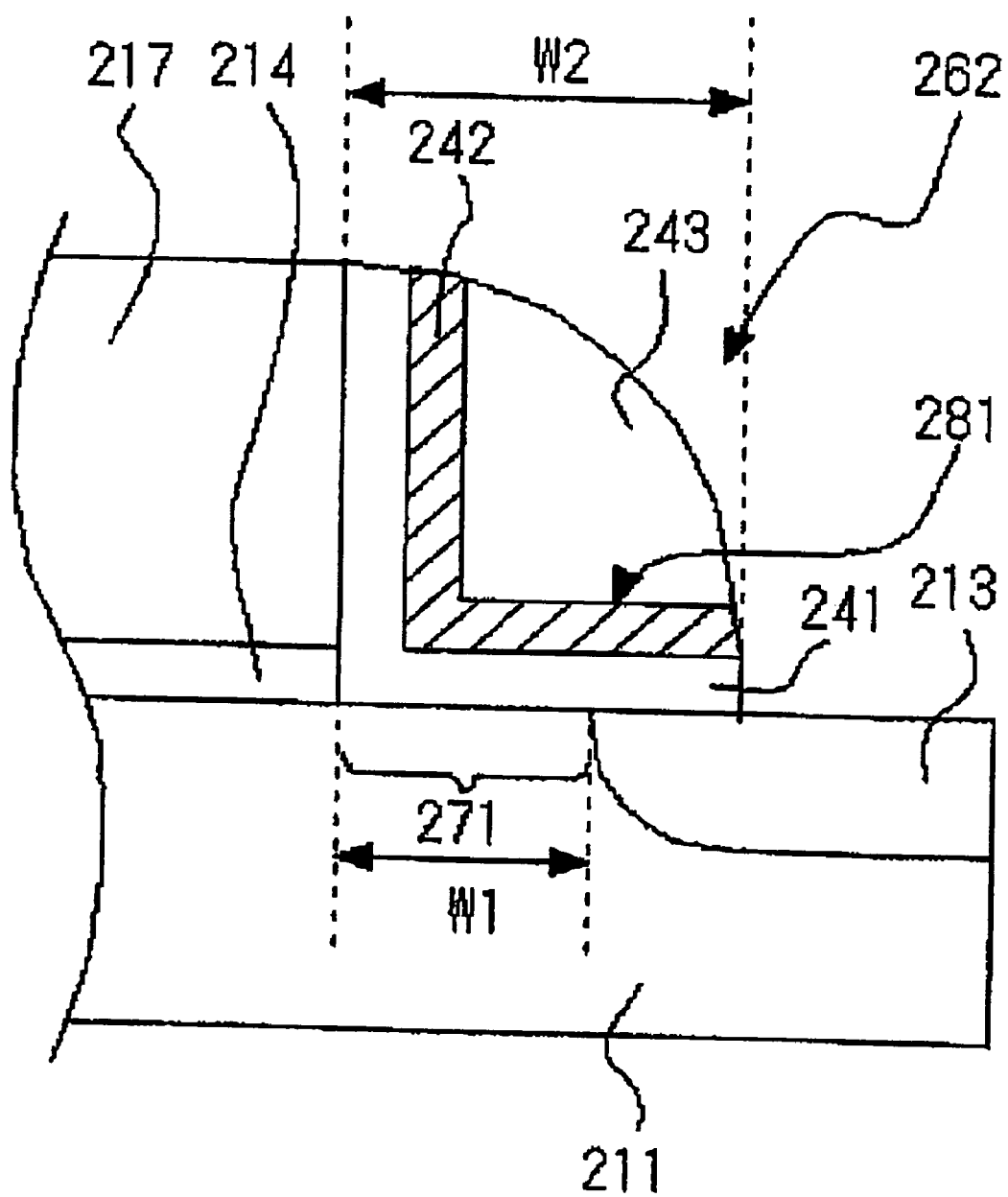
FIG. 9 is a schematic, partially enlarged, cross-sectional view showing the memory element of FIG. 8.

As shown in FIG. 9, in the vicinity of the memory function section 262, an offset amount between the gate electrode 217 and the diffusion region 213 is designated W1, while a width of the memory function section 262 in a cross section along a channel length direction of the gate electrode is designated W2. In this case, an overlap amount between the memory function section 262 and the diffusion region 213 is represented by W2−W1. It is important that the silicon nitride film 242 contained in the memory function section 262 overlaps the diffusion region 213, i.e., the relationship W2>W1 is satisfied.

In FIG. 9, in the memory function section 262, an end of the silicon nitride film 242, which is farther from the gate electrode 217, corresponds to an end of the memory function section 262, which is farther from the gate electrode 217. Therefore, the width of the memory function section 262 is defined as W2.

Figure 10:
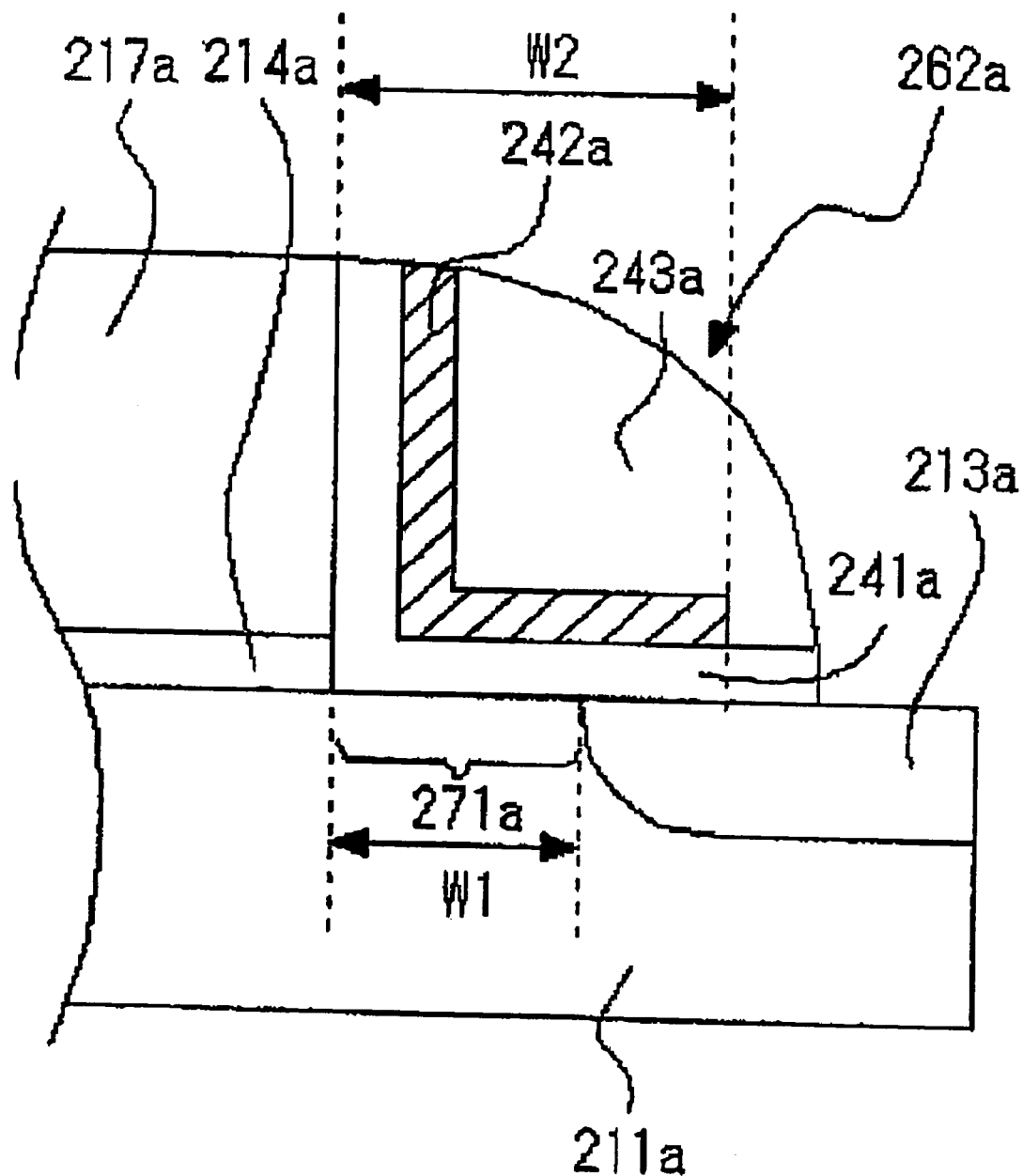
FIG. 10 is a schematic, partially enlarged, cross-sectional view showing a variation of the memory element of FIG. 8.

Note that as shown in FIG. 10, when an end of a silicon nitride film 242a contained in the memory function section 262a, which is farther from a gate electrode 217a, does not correspond to an end of the memory function section 262a, which is farther from the gate electrode 217a, the width W2 of the memory function section 262a is defined as a distance from an end of the gate electrode 217a to an end of a silicon nitride film 242a which is farther from the gate electrode 217a.

Figure 11:
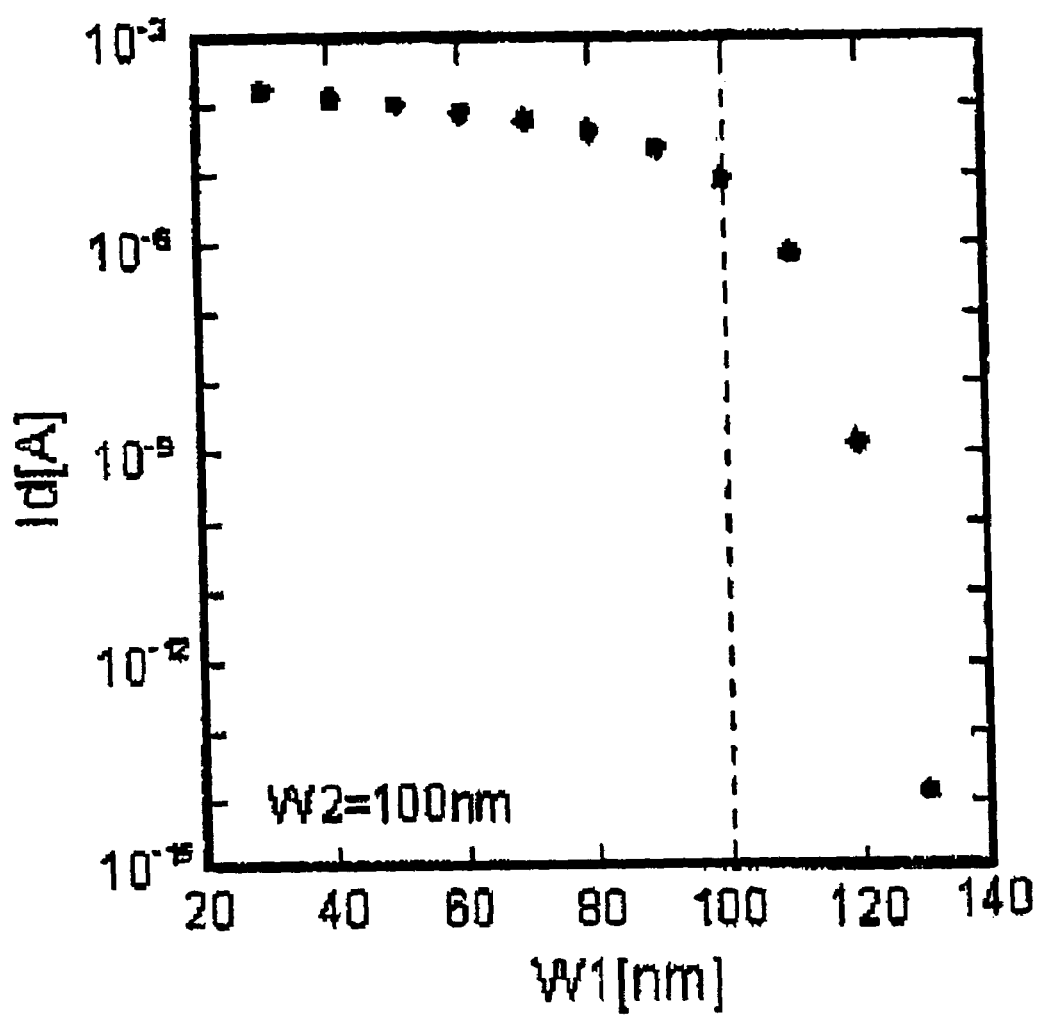
FIG. 11 is a graph showing electric characteristics of a memory element of the semiconductor storage device according to Embodiment 2 of the present invention.

FIG. 11 shows a drain current Id in the memory element structure of FIG. 9 when the width W2 of the memory function section 262 is fixed to 100 nm and the offset amount W1 is changed. In this case, the drain current Id is obtained by performing device simulation, assuming that the memory function Section 262 is in an erasure state (holes are accumulated), and the diffusion regions 212 and 213 are a source electrode and a drain electrode, respectively.

As can be clearly seen from FIG. 11, when W1 is equal to or greater than 100 nm (i.e., the silicon nitride film 242 and the diffusion region 213 do not overlap each other), the drain current Id is rapidly decreased. The value of the drain current Id is substantially proportional to the rate of a read operation. Therefore, when W1 equal to or greater than 100 nm, the performance of the memory is rapidly deteriorated. On the other hand, a decrease in the drain current Id is mild when the silicon nitride film 242 and the diffusion region 213 overlap each other. Therefore, in view of variations in mass production, it is substantially difficult to obtain a memory function unless at least a portion of the silicon nitride film 242 having a function of retaining charges overlaps the source/drain region.

Taking into account the results of the above-described device simulation, a memory cell array was produced where W2 was fixed to 100 nm and W1 was designed to be 60 nm or 100 nm. When W1 was 60 nm, the silicon nitride film 242 and each of the diffusion regions 212 and 213 were designed to overlap each other by 40 nm. When W1 was 100 nm, the silicon nitride film 242 and each of the diffusion regions 212 and 213 were designed not to overlap each other. Read times of these memory cell arrays were measured and the worst cases were compared with each other taking variations thereof into account. As a result, a read access time was 100 times higher when W1 was designed to be 60 nm than when W1 was designed to be 100 nm. In practical applications, a preferable read access time is 100 nanoseconds or less per bit. In the case of W1=W2, this condition cannot be achieved. When variations due to a manufacturing process is taken into account, (W2−W1)>10 nm is preferably established.

To read information from the memory function section 261 (region 281), preferably, the diffusion region 212 is caused to function as a source electrode, the diffusion region 213 is caused to function as a drain region, and a pinch-off point is provided in a portion of the channel region closer to the drain region, as in Embodiment 1. In other words, when information is read from one of the two memory function sections, a pinch-off point is preferably provided in a region of the channel region closer to the other memory function section. Thereby, it is possible to detect information stored in the memory function section 261 with high sensitivity irrespective of the storing state of the memory function section 262, significantly contributing to achievement of two-bit operations.

On the other hand, when information is stored only in one of the two memory function sections or two memory function sections are used in the same memory state, a pinch-off point is not necessarily provided during a read operation.

Note that, as not shown in FIG. 8, a well region (a P-type well in the case of an N channel element) is preferably provided on a surface of the semiconductor substrate 211. By providing the well region, the impurity concentration of the channel region can be optimized with respect to a memory operation (a rewrite operation and a read operation), thereby facilitating the control of other electric characteristics (e.g., breakdown voltage, junction capacity, short channel effect, etc.).

Figure 12:
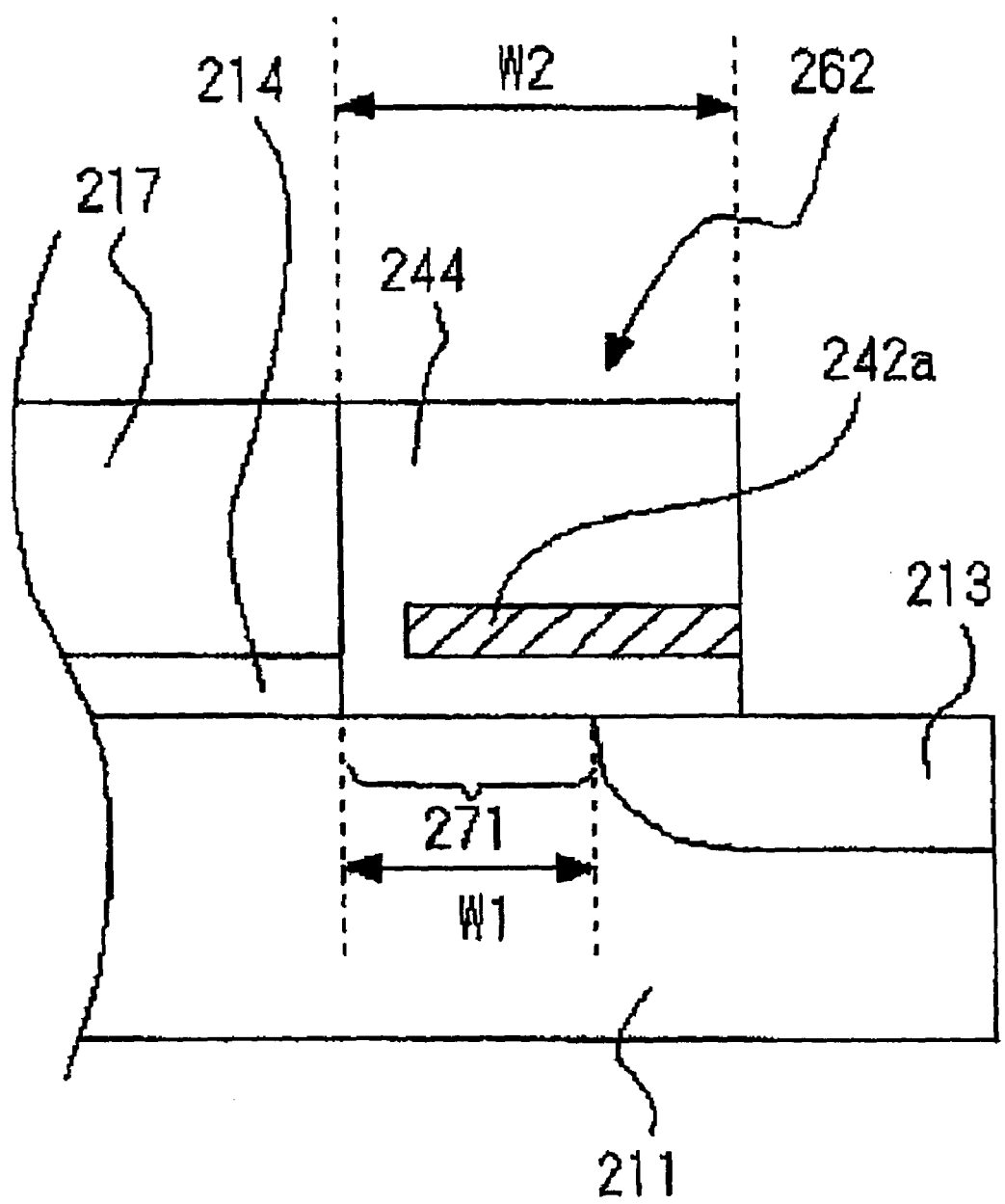
FIG. 12 is a schematic cross-sectional view showing a variation of a memory element of the semiconductor storage device according to Embodiment 2 of the present invention.

In addition, the memory function section preferably comprises a charge retaining film provided substantially parallel to a surface of the gate insulating film. In other words, preferably, an upper surface of the charge retaining film contained in the memory function section is equally spaced from an upper surface of the gate insulating film. Specifically, as shown in FIG. 12, the silicon nitride film 242a (charge retaining film) of the memory function section 262 has a surface substantially parallel to a surface of the gate insulating film 214. In other words, the silicon nitride film 242a is preferably provided at a uniform height above the height of the surface of the gate insulating film 214.

Thus, the memory function section 262 comprises the silicon nitride film 242a substantially parallel to the surface of the gate insulating film 214. Due to this structure, the easiness of formation of an inversion layer in the offset region 271 can be effectively controlled by the more or less of the amount of charges accumulated in the silicon nitride film 242a, thereby increasing the memory effect. In addition, when the silicon nitride film 242a is provided parallel to the surface of the gate insulating film 214, a change in the memory effect can be reduced to a relatively small value even if the offset amount (W1) varies, thereby suppressing a variation in the memory effect. Moreover, the movement of charges toward an upper portion of the silicon nitride film 242a is suppressed, thereby making it possible to suppress a change in characteristics due to the movement of charges during the retaining of a memory.

In addition, preferably, the memory function section 262 comprises an insulating film (e.g., a portion on the offset region 271 of a silicon oxide film 244), which separates the silicon nitride film 242a substantially parallel to the surface of the gate insulating film 214 from the channel region (or a well region). This insulating film suppresses the dissipation of charges accumulated in the charge retaining film, resulting in a memory element having a higher level of ability to retain a memory.

Note that by controlling the film thickness of the silicon nitride film 242a and controlling the film thickness of an insulating film (a portion on the offset region 271 of the silicon oxide film 244) under the silicon nitride film 242a to be constant, a distance from the surface of the semiconductor substrate to charges accumulated in the charge retaining film can be maintained substantially constant. In other words, the distance from the surface of the semiconductor substrate to the charges accumulated in the charge retaining film, can be controlled to be between the minimum film thickness of the insulating film, under the silicon nitride film 242a, and the sum of the maximum film thickness of the insulating film, under the silicon nitride film 242a, and the maximum film thickness of the silicon nitride film 242a. Thereby, the density of electric lines of force generated by charges accumulated in the silicon nitride film 242a can be substantially controlled, thereby considerably reducing a variation in the memory effect of the memory element.

Embodiment 3

Figure 13:
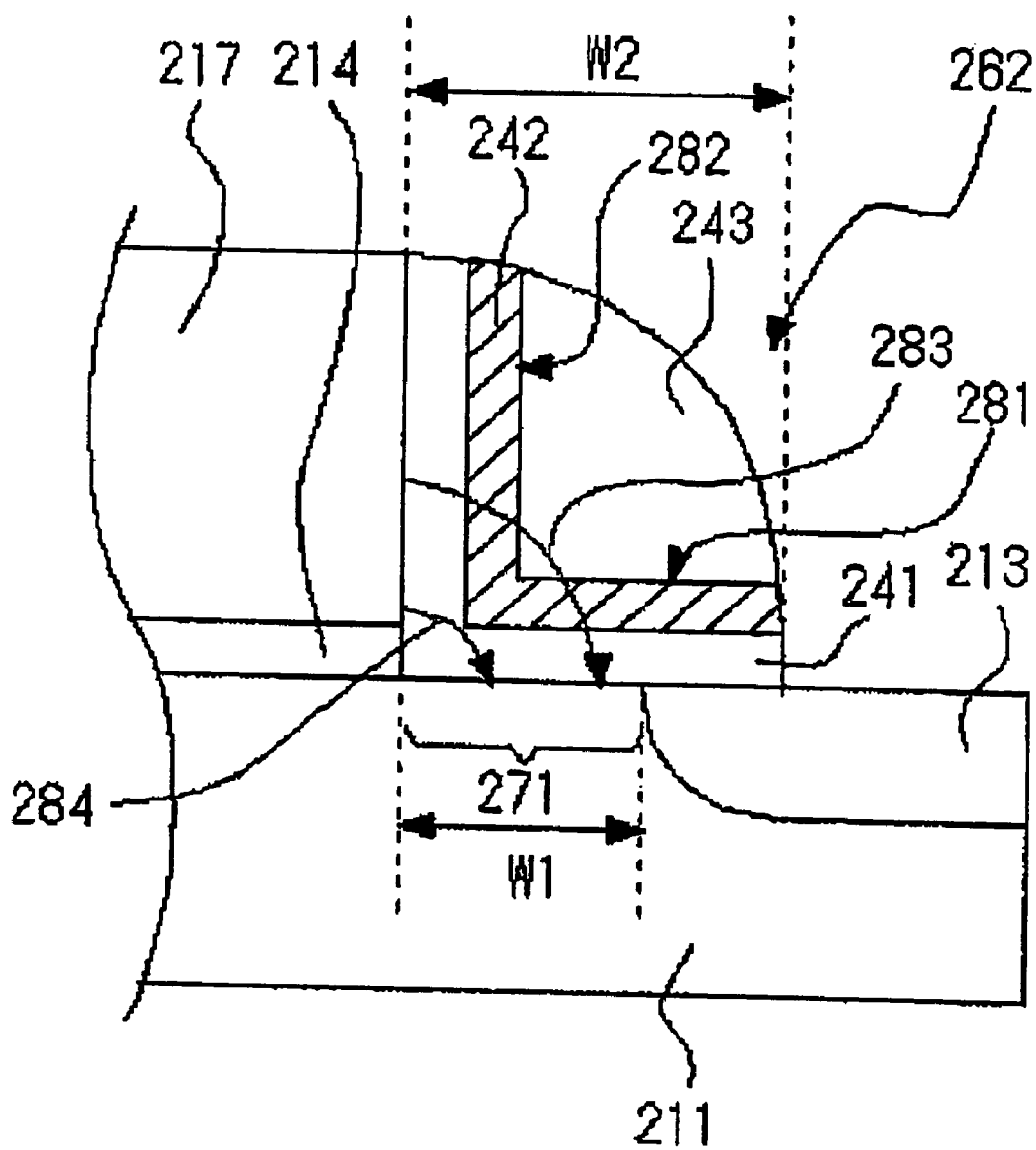
FIG. 13 is a schematic cross-sectional view showing a memory element of a semiconductor storage device according to Embodiment 3 of the present invention.

A memory function section 262 in a semiconductor storage device according to Embodiment 3 of the present invention comprises a silicon nitride film 242 (charge retaining film) which has a substantially uniform film thickness as shown in FIG. 13. The silicon nitride film 242 has a portion (region 281) substantially parallel to a surface of a gate insulating film 214. The silicon nitride film 242 has a portion (region 282) substantially parallel to a side of a gate electrode 217.

When a positive voltage is applied to the gate electrode 217, an electric line of force 283 in the memory function section 262 passes through the silicon nitride film 242 twice (the regions 282 and 281) as shown with an arrow. Note that when a negative voltage is applied to the gate electrode 217, the direction of an electric line of force is reverse. In this case, the relative dielectric constant of the silicon nitride film 242 is about 6, while the relative dielectric constant of the silicon oxide films 241 and 243 is about 4. Therefore, as compared with when only the region 281 (charge retaining film) is provided, the effective relative dielectric constant of the memory function section 262 in the direction of the electric line of force 283 is increased, thereby making it possible to reduce a difference in potential between opposite ends of the electric line of force. In other words, most of a voltage applied to the gate electrode 217 is used to enhance an electronic field in the offset region 271.

The reason charges are implanted into the silicon nitride film 242 during a rewrite operation is that the generated charges are attracted via the electronic field in the offset region 271. Therefore, by providing the charge retaining film indicated by arrow 282, the amount of charges implanted into the memory function section 262 during a rewrite operation is increased, resulting in an increase in a rewriting rate.

Note that when a silicon nitride film is provided instead of the silicon oxide film 243, i.e., the charge retaining film is not uniform with respect to a height corresponding to the surface of the gate insulating film 214, the movement of charges toward an upper portion of the silicon nitride film becomes significant, resulting in a deterioration in the ability to retain a memory.

The charge retaining film may be preferably made of a high dielectric material, such as hafnium oxide or the like, which has a considerably large relative dielectric constant, instead of the silicon nitride film.

In addition, preferably, the memory function section further comprise an insulating film (a portion on the offset region 271 of the silicon oxide film 241) which separates the charge retaining film substantially parallel to the surface of the gate insulating film from the channel region (or the well region). This insulating film suppresses the dissipation of charges accumulated in the charge retaining film, thereby further improving the ability to retain a memory.

In addition, preferably, the memory function section further comprises an insulating film (a portion adjacent to the gate electrode 217 of the silicon oxide film 241) which separates the gate electrode from the charge retaining film extending in a direction substantially parallel to a side of the gate electrode. This insulating film prevent charges from being implanted from the gate electrode to the charge retaining film, so that electric characteristics are not changed, thereby making it possible to improve the reliability of the memory element.

Moreover, as in Embodiment 2, the film thickness of the insulating film (a portion on the offset region 271 of the silicon oxide film 241) under the silicon nitride film 242 is preferably controlled to be constant. Also, as in Embodiment 2, the film thickness of the insulating film (a portion adjacent to the gate electrode 217 of the silicon oxide film 241) on a side of the gate electrode is preferably controlled to be constant. Thereby, the density of electric lines of force generated by charges accumulated in the silicon nitride film 242 can be substantially controlled, and the leakage of charges can be prevented.

Embodiment 4

In Embodiment 4, optimization of distances between a gate electrode, a memory function section, and source/drain regions in a memory element of a semiconductor storage device will be described below.

Figure 14:
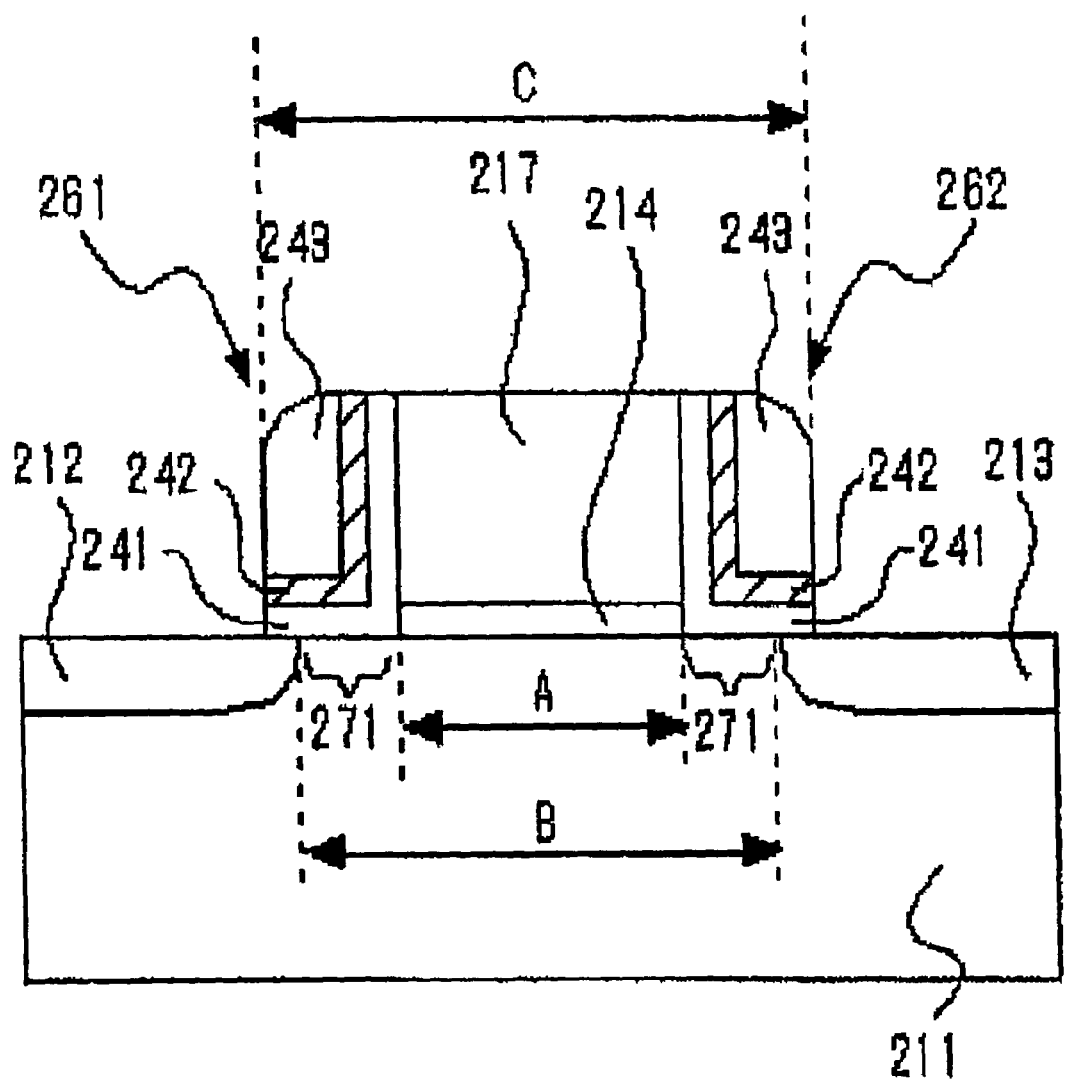
FIG. 14 is a schematic cross-sectional view showing a memory element of a semiconductor storage device according to Embodiment 4 of the present invention.

As shown in FIG. 14, A indicates a length of a gate electrode in a cross-section taken along a channel length direction; B indicates a distance between source/drain regions (channel length); and C indicates a distance from an end of one memory function section to an end of the other memory function section, i.e., from an end (a farther end from the gate electrode) of a film having a function of retaining charges in one memory function section to an end (a farther end from the gate electrode) of a film having a function of retaining charges in the other memory function section in the cross-section taken along the channel length direction.

In the above-described memory element, B<C is preferable. When such a relationship is satisfied, an offset region 271 exists between a portion under a gate electrode 217 of a channel region and diffusion regions 212 and 213. Thereby, the easiness of inversion effectively varies throughout the offset region 271 due to charges accumulated in the memory function sections 261 and 262 (silicon nitride film 242). Therefore, the memory effect is increased, particularly resulting in a high-rate read operation.

When the diffusion regions 212 and 213 are offset from the gate electrode 217, i.e., A<B is satisfied, the easiness of inversion of the offset region when a voltage is applied to the gate electrode 217 is significantly changed, depending on the amount of charges accumulated in the memory function section. The memory effect can be enhanced while the short channel effect can be reduced.

Note that the offset region 271 may not be necessarily required as long as the memory effect is obtained. Even when the offset region 271 is not provided, the memory effect may be obtained in the memory function sections 261 and 262 (the silicon nitride film 242) if the impurity concentration of the diffusion regions 212 and 213 are sufficiently low.

Accordingly, A<B<C to most preferable.

Embodiment 5

Figure 15:
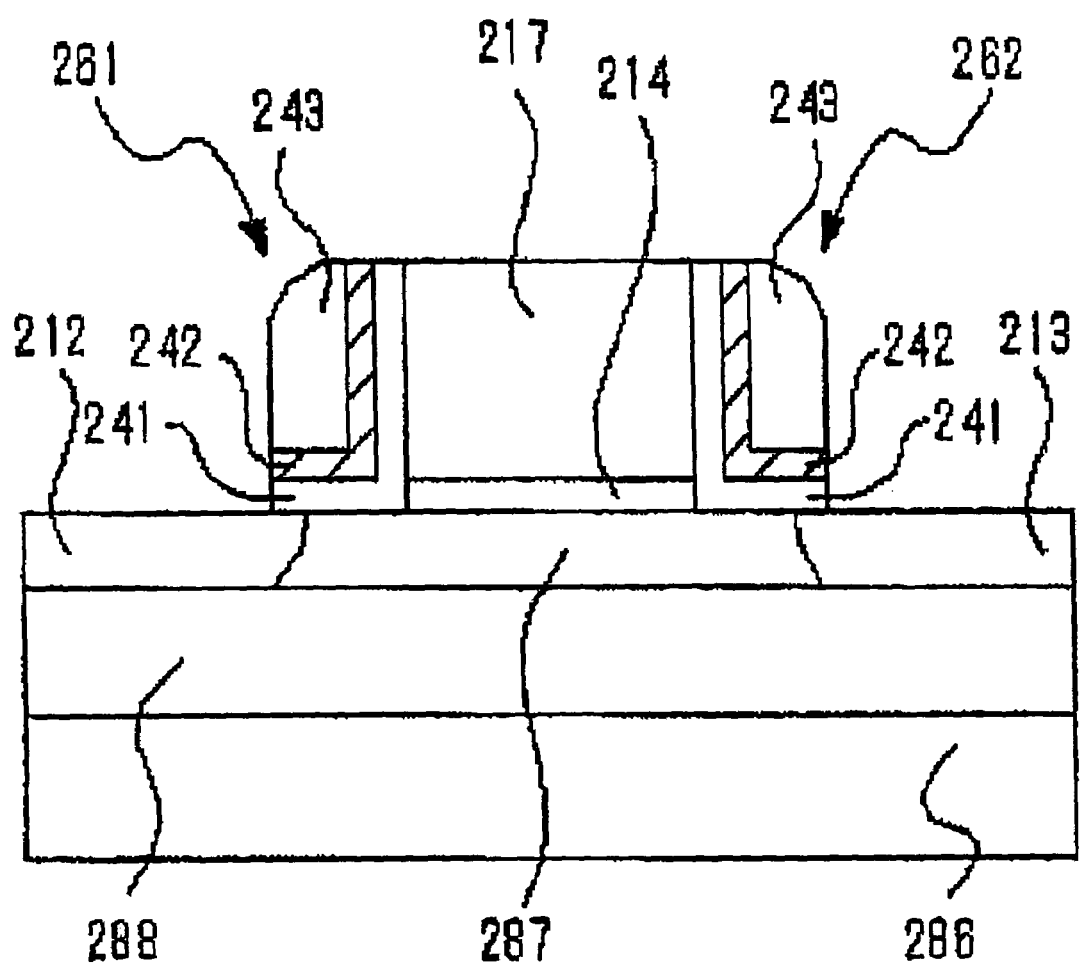
FIG. 15 is a schematic cross-sectional view showing a memory element of a semiconductor storage device according to Embodiment 5 of the present invention.

A memory element of a semiconductor storage device according to Embodiment 5 of the present invention has substantially the same structure as that of the memory element of Embodiment 2, except that the semiconductor substrate is an SOI substrate as shown in FIG. 15.

In this memory element, a buried oxide film 288 is provided on a semiconductor substrate 286. An SOI layer is provided on the buried oxide film 288. Diffusion regions 212 and 213 are provided in the SOI layer, and the other region of the SOI layer is a body region 287.

This memory element has an action and effect similar to those of the memory element of Embodiment 2. In addition, the junction capacity between the diffusion regions 212 and 213 and the body region 287 can be significantly reduced, thereby making it possible to increase the speed of the element and reduce the power consumption thereof.

Embodiment 6

Figure 16:
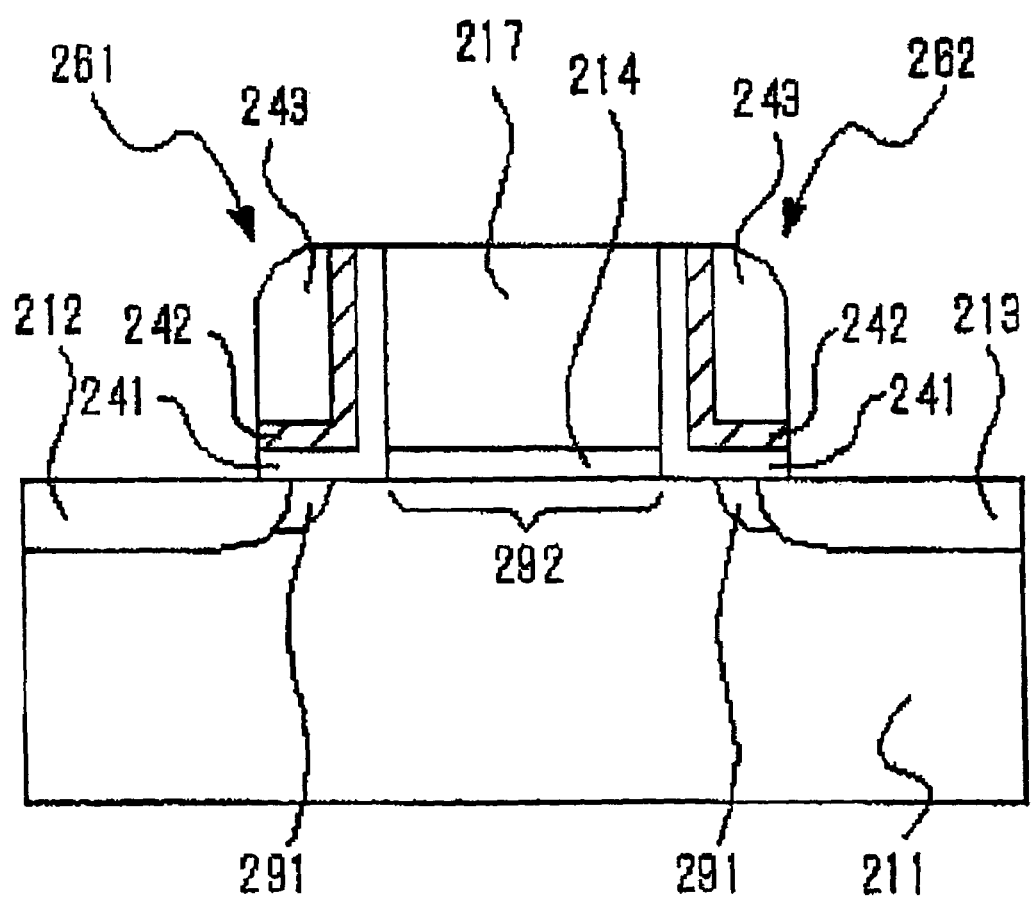
FIG. 16 to a schematic cross-sectional view showing a memory element of a semiconductor storage device according to Embodiment 6 of the present invention.

A memory element of a semiconductor storage device according to Embodiment 6 of the present invention has substantially the same structure as that of the memory element of Embodiment 2, except that a P-type high concentration region 291 is added to a channel side of the N-type diffusion regions 212 and 213 as shown in FIG. 16.

Specifically, the P-type high concentration region 291 has a higher impurity (e.g., boron, etc.) concentration, which provides a P-type, than the impurity concentration of a region 292, which provides a P-type. An appropriate P-type impurity concentration of the P-type high concentration region 291 is, for example, about $5 \times 10^{17}$ cm$^{-3}$ to about $1 \times 10^{19}$ cm$^{-3}$. The P-type impurity concentration of the region 292 is for example, $5 \times 10^{16}$ to $1 \times 10^{18}$ cm$^{-3}$.

Thus, by providing the P-type high concentration region 291, the junction between the diffusion regions 212 and 213 and the semiconductor substrate 211 is steep directly under the memory function sections 261 and 262. Therefore, hot carriers are easily generated during write and erase operations, so that a voltage required for write and erase operations can be reduced, or the speed of write and erase operations can be increased. Moreover, since the impurity concentration of the region 292 is relatively low, the threshold is low when the memory element to in the erasure state, so that the drain current is increased. Therefore, the read rate is improved. As a result, it is possible to obtain a memory element having a low rewriting voltage or a high rewriting rate, and a high read rate.

In FIG. 16, by providing the P-type high concentration region 291 in the vicinity of a source/drain region and under a memory function section (i.e., not directly under the gate electrode), the threshold of the whole transistor is significantly increased. The degree of this increase 18 significantly large as compared with when the P-type high concentration region 291 is located directly under the gate electrode. When writing charges (electrons in the case where the transistor is of an N channel type) are accumulated in the memory function section, the degree of the increase is more significant. On the other hand, when a sufficient amount of erasure charges (holes in the case where the transistor is of an N channel type) are accumulated in the memory function section, the threshold of the whole transistor is reduced to a threshold, which is determined depending on the impurity concentration of the channel region (region 292) under the gate electrode. In other words, the erasure threshold does not depend on the impurity concentration of the P-type high concentration region 291. In contrast, the writing threshold 16 considerably significantly influenced. Therefore, by providing the P-type high concentration region 291 under the memory function section and in the vicinity of the source/drain region, only the writing threshold considerably significantly varies, and the memory effect (a difference in threshold between write and erase operations) is significantly increased.

Embodiment 7

Figure 17:
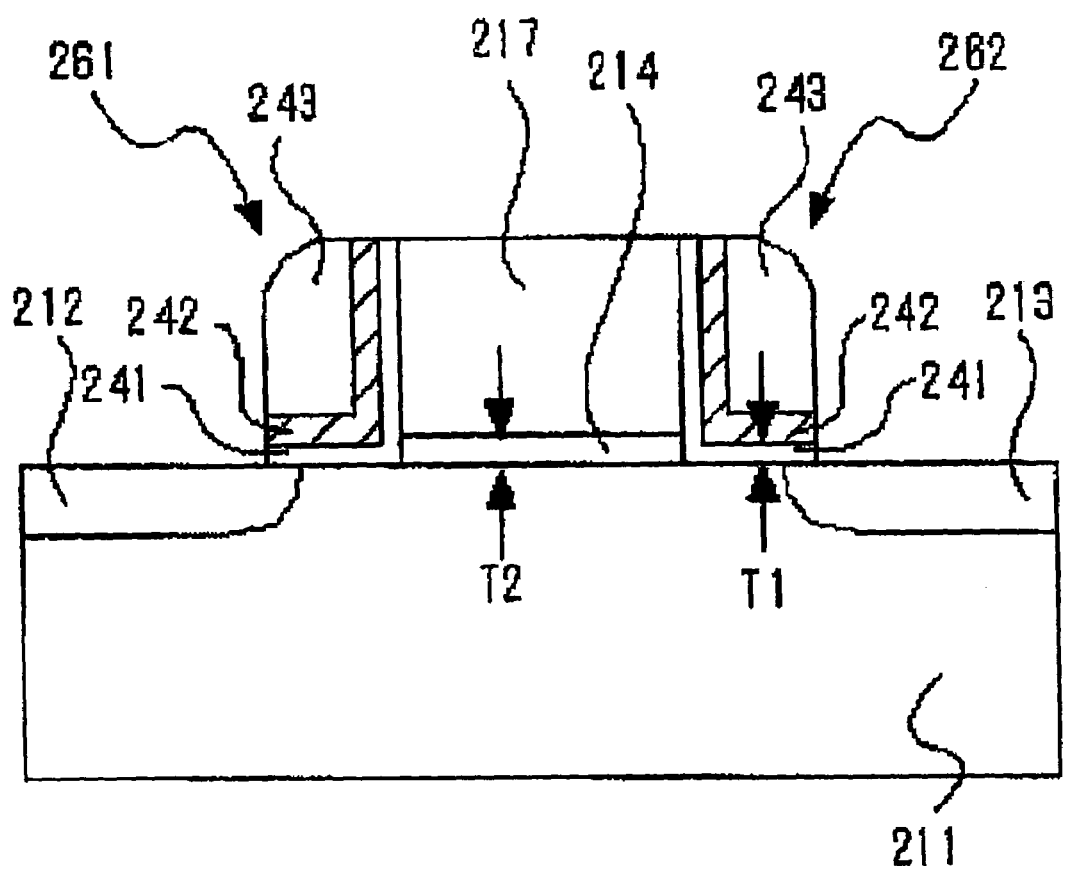
FIG. 17 is a schematic cross-sectional view showing a memory element of a semiconductor storage device according to Embodiment 7 of the present invention.

A memory element of a semiconductor storage device according to Embodiment 7 of the present invention has substantially the same structure as that of the memory element of Embodiment 2, except that the thickness (T1) of an insulating film separating a charge retaining film (a silicon nitride film 242) from a channel region or a well region, is smaller than the thickness (T2) of a gate insulating film as shown in FIG. 17.

The thickness (T2) of a gate insulating film 214 has a lower limit because of the requirement for a breakdown voltage during a memory rewrite operation. However, the thickness (T1) of the Insulating film can be smaller than T2 irrespective of the requirement for a breakdown voltage.

In this memory element, the reason the degree of freedom of designing T1 is high as described above, is as follows.

In this memory element, the insulating film separating the charge retaining film from the channel region or the well region, is not interposed between the gate electrode and the channel region or the well region. Therefore, a high electronic field applying between the gate electrode and the channel region or the well region does not act directly on the insulating film separating the charge retaining film from the channel region or the well region. Instead, there is a relatively weak electronic field spreading horizontally from the gate electrode. Therefore, T1 can be smaller than T2 irrespective of the requirement for a breakdown voltage to the gate insulating film.

By decreasing T1, it can be made easier to implant charges into a memory function section, so that a voltage required for writing and erase operations can be lowered, or the speed of writing and erase operations can be increased. In addition, when charges are accumulated in a silicon nitride film 242, the amount of charges induced by the channel region or the well region is increased, thereby making it possible to enhance the memory effect.

Among the electric lines of force in the memory function section, there is a short electric line of force, which does not pass through the silicon nitride film 242, as shown with arrow 284 in FIG. 13. The intensity of an electronic field on such a short electric line of force is relatively great, and therefore, the electronic field along the electric line of force plays a significant role in a rewrite operation. By decreasing T1, the silicon nitride film 242 is shifted toward the bottom of the figure, so that the electric line of force indicated by arrow 283 passes through the silicon nitride film. Therefore, the effective relative dielectric constant along the electric line of force 284 in the memory function section is increased, thereby making it possible to reduce a difference in potential between opposite ends of the electric line of force. Therefore, most of a voltage applied to a gate electrode 217 is used so as to enhance an electronic field in an offset region, resulting in high-speed writing and erase operations.

In contrast to this, for example, EEPROM, such as, representatively, a flash memory or the like, comprises an insulating film separating a floating gate from a channel region or a well region, which is interposed between a gate electrode (control gate) and the channel region or the well region. A high electronic field directly acts from the gate electrode onto the insulating film. Therefore, in EEPROM, the thickness of the insulating film separating the floating gate from the channel region or the well region is limited, so that the optimization of the function of a memory element is inhibited.

As is clearly understood from the above description, by setting T1<T2, the voltage required for write and erase operations can be reduced, or the speed of writing and erase operations can be increased, and the memory effect can be enhanced, without reducing the ability of a memory element to withstand with voltage. Note that the thickness T1 of the insulating film is preferably equal to or greater than 0.8 nm, in which range the thickness T1 can maintain a prescribed level of uniformity or film quality during manufacturing processes, and the ability to retain a memory is not considerably deteriorated.

Specifically, in the case of a liquid crystal driver LSI which has a high withstand voltage in a design rule, a maximum voltage of 15 to 18 V is required to drive a liquid crystal panel TFT. Therefore, generally, a thin gate oxide film cannot be obtained. When a non-volatile memory of the present invention for adjusting images is incorporated into a liquid crystal driver LSI, the thickness of the insulating film separating the charge retaining film (silicon nitride film 242) from the channel region or the well region can be designed to be optimized, independently of the thickness of the gate insulating film, in the memory element of the present invention. For example, in a memory cell having a gate electrode length (word line width) of 250 nm, T1 and T2 are separately determined to be 20 nm and 10 nm, respectively. Thereby, a memory cell having a satisfactory level of writing efficiency can be obtained. (The reason a short channel effect does not occur even when T1 is greater than the thickness of typical logic transistors, is that a source/drain region is offset from the gate electrode).

Embodiment 8

Figure 18:
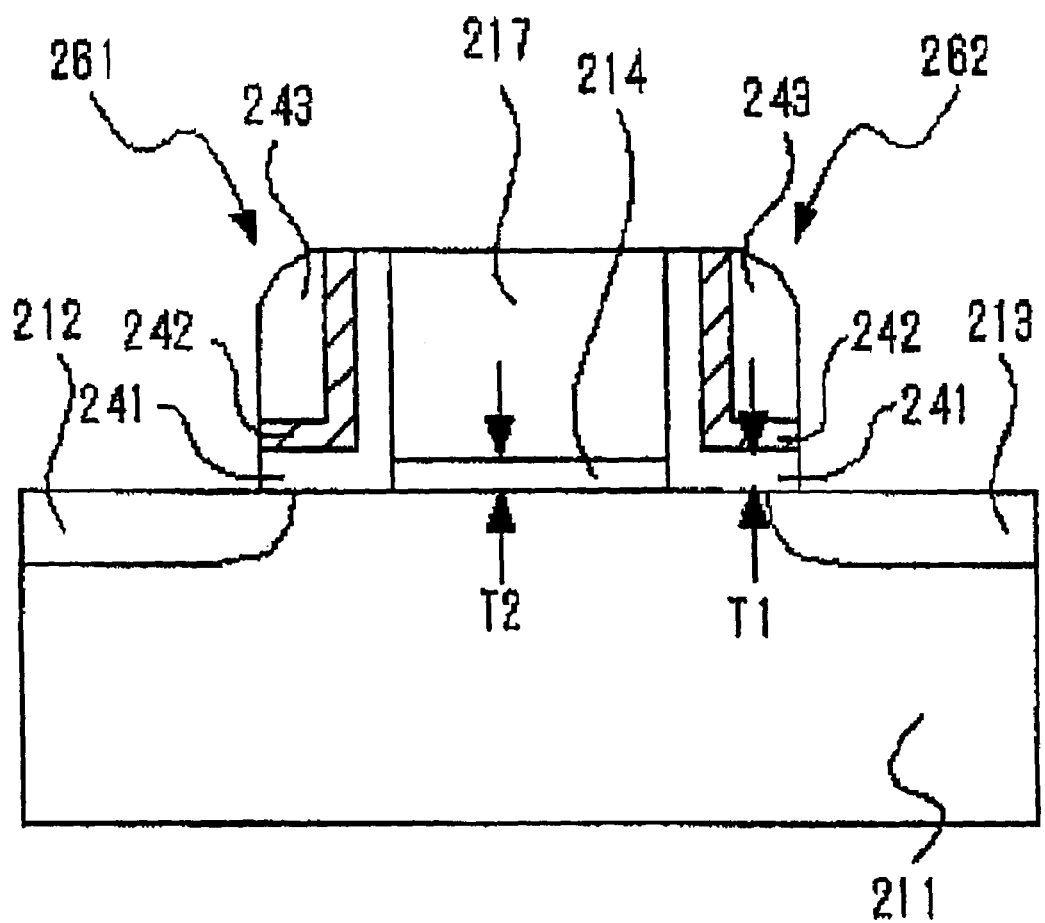
FIG. 18 is a schematic cross-sectional view showing a memory element of a semiconductor storage device according to Embodiment 8 of the present invention.

A memory element of a semiconductor storage device according to Embodiment 8 of the present invention has substantially the same structure as that of Embodiment 2, except that a thickness (T1) of an insulating film separating a charge retaining film (silicon nitride film 242) from a channel region or a well region to greater than a thickness (T2) of a gate insulating film as shown in FIG. 18.

The thickness (T2) of the gate insulating film 214 has an upper limit value due to the requirement of prevention of a short channel effect of the memory element. However, the thickness (T1) of the insulating film can be made greater than T2 irrespective of the requirement of prevention of a short channel effect. Thus, the thickness of the insulating film separating the charge retaining film (silicon nitride film 242) from the channel region or the well region can be optimized, independently of the thickness of the gate insulating film. Therefore, when the degree of scaling of miniaturization is increased (the gate insulating film becomes thinner), the memory function section does not obstruct the scaling.

In this memory element, the reason that the degree of freedom of design of T1 is high, is that the insulating film separating the charge retaining film from the channel region or the well region is not interposed between the gate electrode and the channel region or the well region, as described above. Therefore, it is possible to make T1 greater than T2 irrespective of the requirement of prevention of a short channel effect for the gate insulating film.

By increasing T1, the dissipation of charges accumulated in the memory function section can be prevented, thereby improving the ability to retain a memory.

Therefore, by setting T1>T2, the ability to retain a memory can be improved without deteriorating the short channel effect of the memory element.

Note that the thickness (T1) of the insulating film is preferably 20 nm or less, taking a reduction in the rewriting rate into consideration.

Specifically, in a non-volatile memory, such as, representatively, a flash memory or the like, a selection gate electrode to a writing/erasure gate electrode and a gate insulating film (including a floating gate) corresponding to the writing/erasure gate electrode also functions as a charge accumulation film. Therefore, the requirement for miniaturization (a thin film is essential for suppression of a short channel effect) is contrary to the requirement for reliability (to suppress leakage of retained charges, the insulating film separating the floating gate from the channel region or the well region cannot be equal to or less than about 7 nm). Therefore, miniaturization is difficult. In fact, ITRS (International Technology Roadmap for Semiconductors) shows that there is no prospect that the physical length of a gate is miniaturized to about 0.2 µm or less. In this memory element, T1 and T2 can be separately designed as described above, thereby making it possible to realize miniaturization.

For example, for a memory cell having a gate electrode length (word line width) of 45 nm, T2 and T1 are separately set to be 4 nm and 7 nm, respectively, thereby making it possible to realize a memory element free from a short channel effect. The reason a short channel effect does not occur even when T2 is greater than the thickness of typical logic transistors, is that a source/drain region is offset from the gate electrode.

Since a source/drain region is offset from the gate electrode in the memory element, miniaturization is easier as compared with typical logic transistors.

Thus, there is no electrode for aiding write and erase operations on an upper portion of the memory function section. Therefore, a high electronic field applied between an electrode for aiding write and erase operations and the channel region or the well region does not act directly on the insulating film separating the charge retaining film from the channel region or the well region. Only a relatively weak electronic field, which spreads horizontally from the gate electrode acts on the insulating film. Therefore, it is possible to realize a memory element having a gate length smaller than that of logic transistors for the same process generation.

Embodiment 9

Embodiment 9 relates to a change in electric characteristics of a memory element of a semiconductor storage device of the present invention when rewriting is performed.

Figure 19:
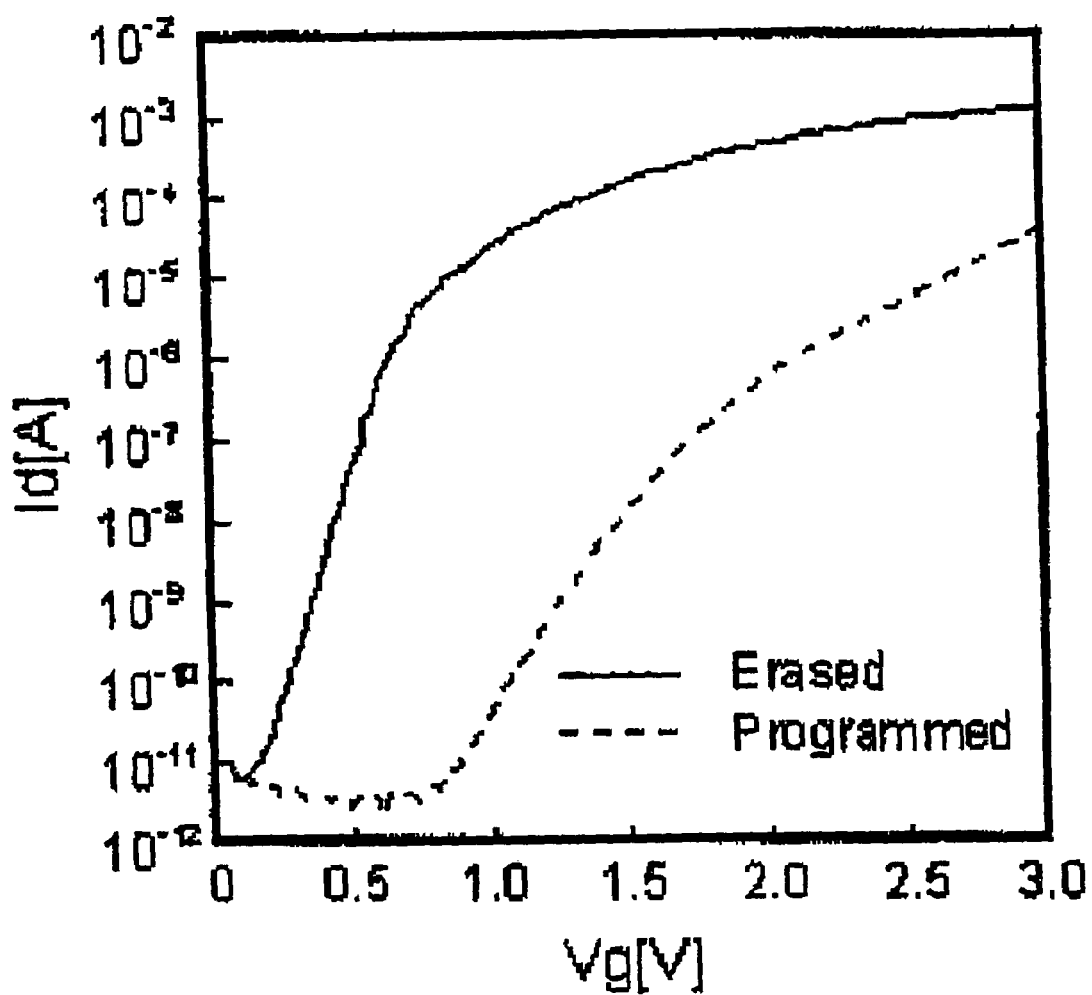
FIG. 19 is a graph showing electric characteristics of a memory element of a semiconductor storage device according to Embodiment 9 of the present invention.

FIG. 19 shows drain current (Id) vs. gate voltage (Vg) characteristics (actual measured values) of an N-channel type memory element when the amount of charges in a memory function section is changed.

As can be seen from FIG. 19, when writing is performed from an erasure state (solid line), not only a threshold increases, but also the gradient of the graph is significantly reduced particularly in a subthreshold region. Therefore, even in a region having a relatively high gate voltage (Vg), the drain current ratio between the erasure state and the writing state is large. For example, even at Vg=2.5 V, the current ratio is about $10^2$ or more. These characteristics are significantly different from those of flash memories (FIG. 26).

The emergence of such characteristics is a peculiar phenomenon which occurs because the gate electrode and the diffusion region are offset from each other and a gate electronic field is unlikely to reach the offset region. When the memory element is in a writing state, an inversion layer is considerably unlikely to occur in the offset region under the memory function section even if a positive voltage is applied to the gate electrode. This is responsible for the small gradient of the Id-Vg curve at the subthreshold region in the writing state.

When the memory element is in an erasure state, electrons are induced in the offset region with high density. Further, when a voltage of 0 V is applied to the gate electrode (i.e., OFF state), electrons are not induced in a channel under the gate electrode (therefore, an off current is small). For this reason, the gradient of the Id-Vg curve in the subthreshold region ls large in the erasure state, and the increasing rate of a current (conductance) is high even in a region equal to or higher than the threshold.

As can be seen from the above description, the memory element contained in the semiconductor storage apparatus of the present invention can have a particularly large drain current ratio between write and erase operations.

Embodiment 10

Figure 20:
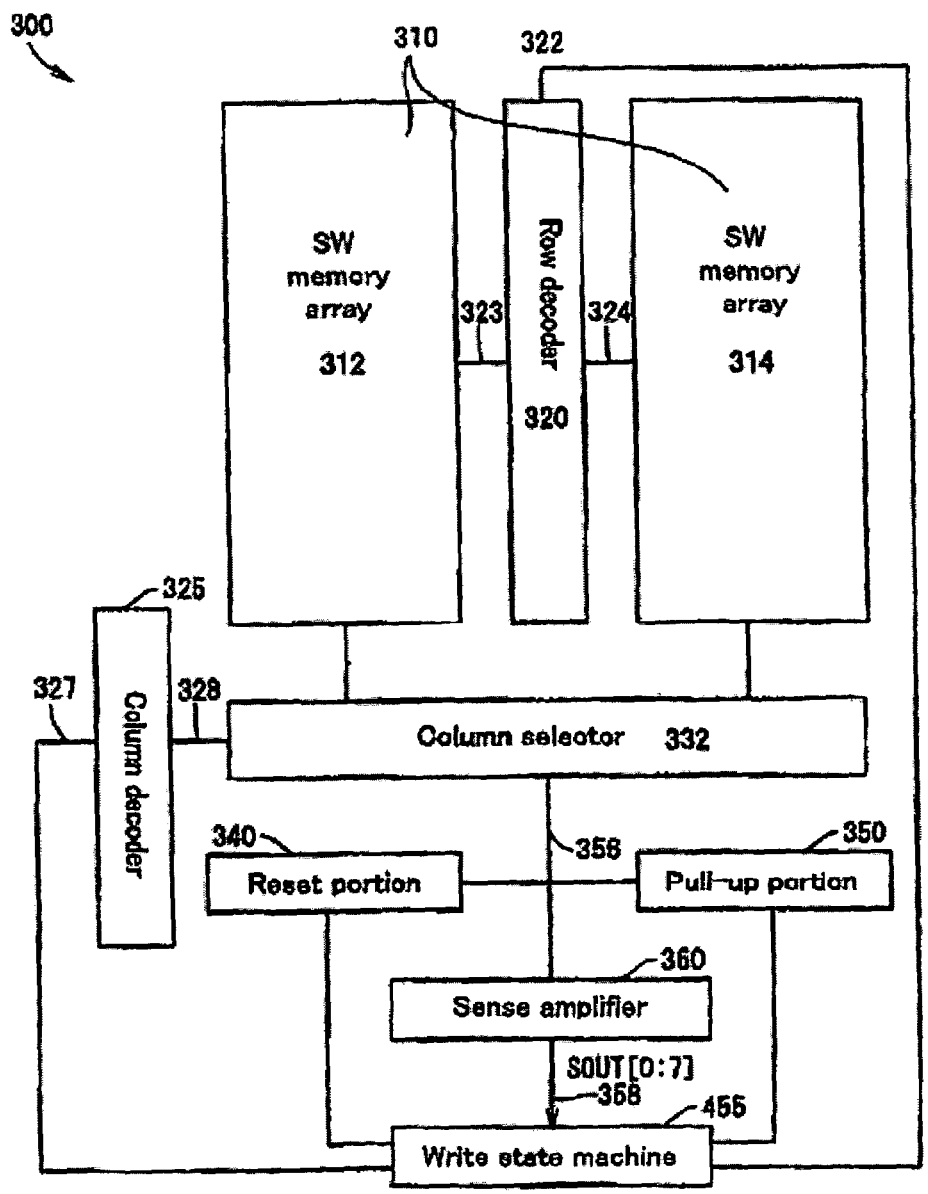
FIG. 20 is a schematic diagram showing a structure of a semiconductor storage device according to Embodiment 10 of the present invention.

FIG. 20 is a schematic diagram showing a semiconductor storage device 300 according to Embodiment 10 of the present invention.

The semiconductor storage device 300 comprises a side wall memory array 310, a row decoder 320, a column decoder 325, a column selector 332, a reset portion 340, pull-up portion 350, and a sense amplifier 360.

The side wall memory array 310 is physically divided into two memory arrays (i.e., a side wall memory array 312 and a side wall memory array 314).

The side wall memory array 312 and the side wall memory array 314 each comprise 1,024 rows and 512 columns of memory elements. The side wall memory array 310 can store 1,048,576 bits of information (i.e., 1 megabit of information).

The side wall memory array 312 and the side wall memory array 314 each comprise 1,024 word lines and 512 bit lines. The gate electrodes of 512 memory elements are connected to each of 1,024 word lines. The drain electrodes of 1,024 memory elements are connected to each of 522 bit lines.

Each word line extends throughout the side wall memory arrays 312 and 314.

Each memory element contained in the side wall memory array 310 has the came structure as that of the memory element of any one of Embodiments 1 to 9. Although the memory elements of Embodiments 1 to 9 can each store two bits of information, only one bit of information it stored in one memory element of Embodiment 10.

Referring back to FIGS. 3, 4, 7 and 8, after information is written into one of the two memory function sections in a memory element, when the information is read from the memory function section, the direction of a current to the memory element during the read operation is opposite to that during the write operation.

However, the direction of a current to a memory element during a write operation is not constantly opposite to that during a read operation.

Under some voltage conditions during a read operation, the direction of a current to a memory element during a write operation can be the same as that during a read operation.

An example of voltage conditions, under which the direction of a current to a memory element during a write operation is the same as that during a read operation, will be described blow.

During a write operation, the gate electrode: 5 V, the drain electrode: 5 V, and the source electrode: 0 V During a read operation, the gate electrode: 3 V, the drain electrode: 0.5 V, and the source electrodes 0 V Under such voltage conditions, while electrons are injected into a memory function section closer to the drain electrode during a write operation, the state of charges in the memory function section can be detected during a read operation by causing a current to flow in the same direction as that during a write operation. This is because a voltage, is applied to the drain electrode during a read operation, is 0.5 V. Therefore, pinch-off does not occur in the vicinity of the drain electrode, so that a current flowing through a memory element is affected by the presence or absence of charges retained in the memory function section.

Note that voltage conditions, under which the direction of a current to a memory element during a write is operation is the same as that during a read operation, are not limited to the above-described voltage conditions.

Hereinafter, the side wall memory array 310, which stores 1,048,576 bits of information, will be described. It is not intended that the capacity of the side wall memory array is limited to 1,048,576 bits of information. The side wall memory array may be one that stores more than 1,048,576 bits of information or less than 1,048,576 bits of information. The maximum size of information, which can be stored by a side wall memory array, may be 4 megabits (4,194,304 bits). In another embodiment, the maximum size of information, which can be stored by a side wall memory array, may be 256 kilobytes.

The row decoder 320 is connected to each word line provided in the side wall memory array 312 and the side wall memory array 314 via a line 323 and a line 324, respectively. The row decoder 320 is also connected to an address line 322. The row decoder 320 decodes an address signal input via the address line 322, and based on a row address indicated by the decoded signal, selects one of the 1,024 word lines in the memory arrays 312 and/or 314.

The column decoder 325 decodes an address signal input via a line 327, and outputs the decoded signal via a line 328 to the column selector 332.

The column selector 332 selects one of the 1,024 bit lines provided throughout the side wall memory array 310 based on a column address indicated by a signal decoded by the column decoder 325.

The bit line selected by the column selector 332 is connected via a line 356 to the reset portion 340. The reset portion 340 connects the bit line selected by the column selector 332 to ground based on a signal output by the write state machine 455.

The bit line selected by the column selector 332 is also connected via the line 356 to the pull-up portion 350. The pull-up portion 350 applies a rewrite voltage to the bit line selected by the column selector 332 based on a signal output by the write state machine 455.

The reset portion 340 and the pull-up portion 350 each equalize the potentials of the drain electrodes of a plurality of memory elements connected to the bit line selected by the column selector 332, and therefore, may be called equalization portions.

The bit line selected by the column selector 332 is also connected via the line 356 to the sense amplifier 360. The sense amplifier 360 senses the voltage of the line 356. A signal SOUT[0:7] sensed by the sense amplifier 360 is output via a line 358 to the write state machine 455. Data indicated by the signal SOUT[0:7] is data read from a memory element selected by the row decoder 320 and the column selector 332.

According to an address signal input via the line 322 and the line 327, data is read from a particular one of the memory elements contained in the side wall memory array 310.

The write state machine 455 outputs an address signal to the row decoder 320 and the column decoder 325 via the line 322 and the line 327, respectively.

The write state machine 455 can perform a write operation with respect to one of the memory elements contained in the side wall memory array 310 and can also perform an erase operation with respect to one of the memory elements.

To perform a write operation or an erase operation with respect to a desired one of the memory elements, the write state machine 455 outputs an address signal is specifying the desired memory element via the lines 322 and the line 327 to the row decoder 320 and the column decoder 325. As a result, a voltage is applied to the gate electrode and the drain electrode of the memory element specified by the address signal, so that the desired one of the memory elements can be selected.

Figure 21:
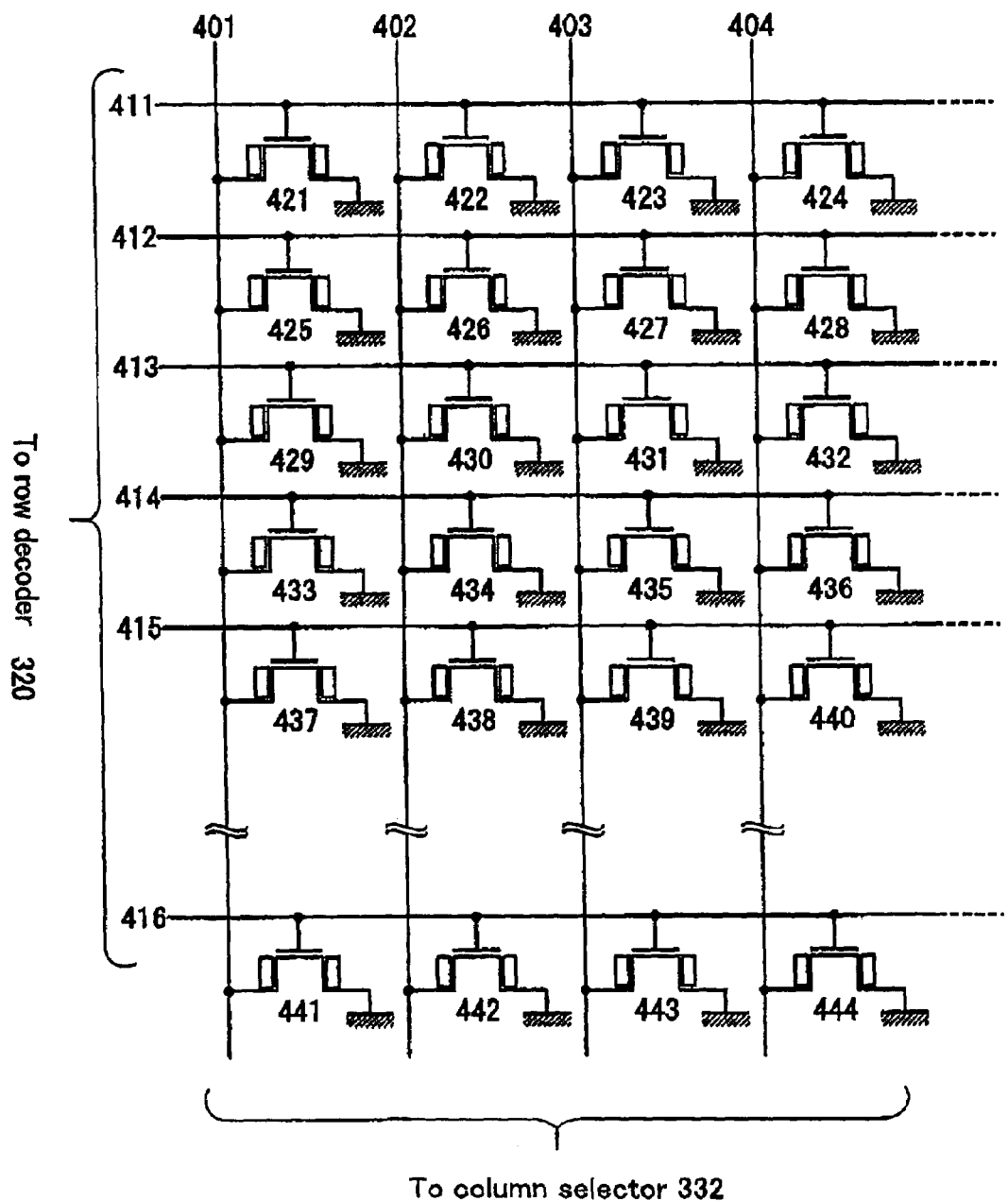
FIG. 21 is a schematic diagram showing a memory array in the semiconductor storage device of Embodiment 10.

FIG. 21 is a schematic diagram showing a configuration of a memory array in the semiconductor storage device (Embodiment 10) of the present invention. FIG. 21 shows an enlarged view of the side wall memory array 314, Indicating memory elements 421 to 444.

Each of the memory elements 421 to 444 comprises a drain electrode, a source electrode, and a gate electrode.

Word lines 411 to 416 each extend throughout the side wall memory arrays 312 and 314.

The word lines 411 to 416 are also called row lines. The word lines 411 to 416 are connected to the gate electrodes of their corresponding memory elements specified by particular row addresses. For example, the word line 411 is connected to the gate electrodes of the memory elements 421 to 424. The word lines 411 to 416 are also connected to the row decoder 320 (FIG. 20).

Bit lines 401 to 404 are connected to the drain electrodes of their corresponding memory elements 421 to 444. The bit lines 401 to 404 are also called column lines. Each of the bit lines 401 to 404 is connected to the drain electrodes of a plurality of memory elements specified by particular column addresses. For example, the bit line 401 is connected to the drain electrodes of the memory elements 421, 425, 429, 433, 437 and 441.

In FIG. 21, the source electrodes of the memory elements 421 to 444 are grounded.

The bit lines 401 to 404 are connected to the column selector 332 (FIG. 20).

Referring to FIGS. 20 and 21, the row decoder 320 decodes an address signal input via the line 322, and based on the decoded signal, selects one of the word lines 411 to 416.

The column selector 332 selects one of the bit lines 401 to 404 based on a signal decoded by the column decoder 325.

The column selector 332 connects a particular bit line, via which a write or read operation is to be performed, via the line 356 to the reset portion 340, the pull-up portion 350 and the sense amplifier 360.

Figure 22:
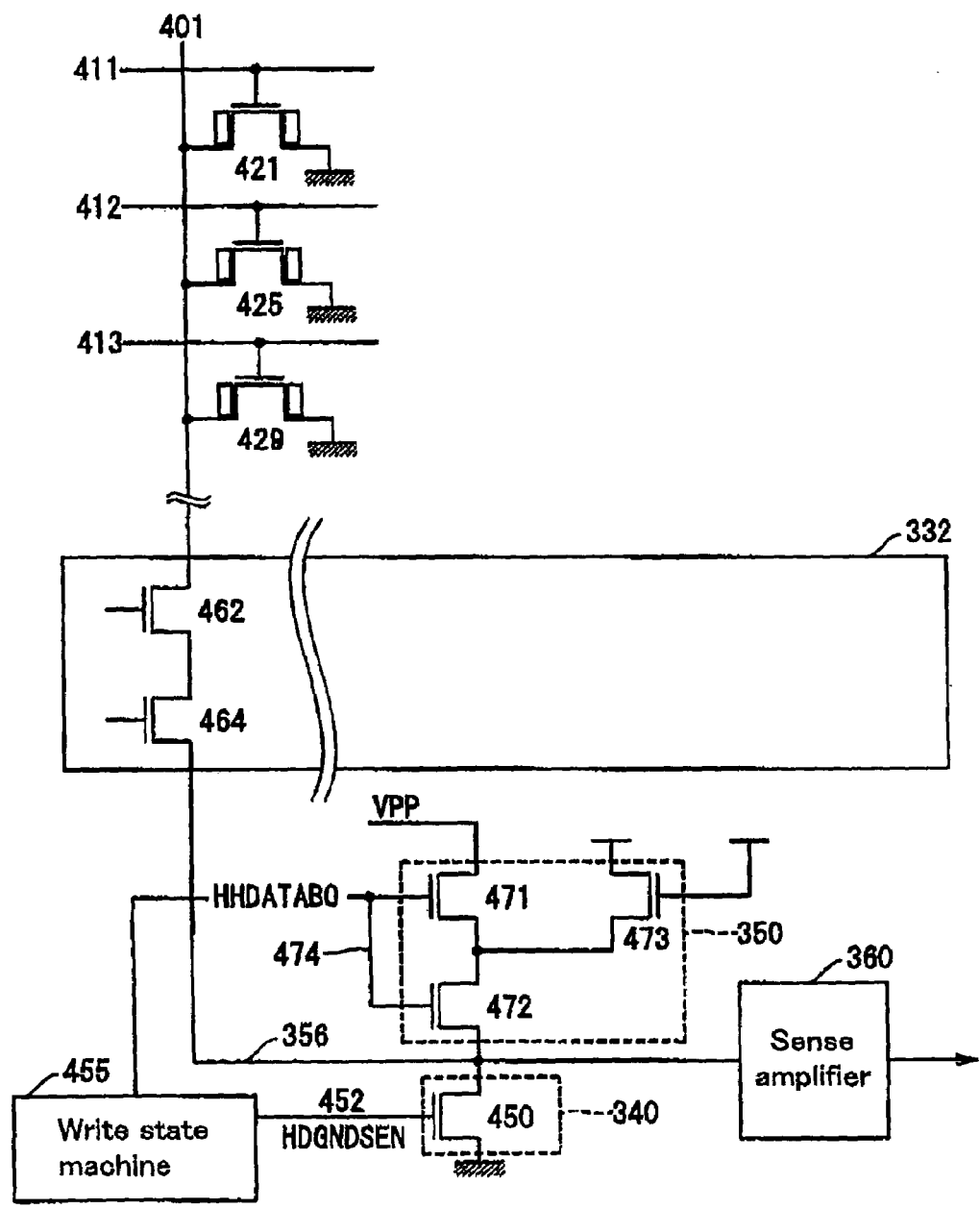
FIG. 22 is a schematic diagram showing a configuration of the semiconductor storage device of Embodiment 10.

FIG. 22 is a schematic diagram showing a configuration of the semiconductor storage device (Embodiment 10) of the present invention.

Referring to FIG. 22, the column selector 332 selects the bit line 401 of the bit lines 401 to 404. A write operation is performed with respect to the memory elements 421, 425 and 429 connected to the bit line 401, and thereafter, a write operation is verified. Such a write and verify operations will be described in greater detail below.

Although a method for performing a write operation and its verify operation will be described below, Embodiment 10 can be applied to an erase operation and its verify operation.

Although only the memory elements 421, 425 and 429 connected to the bit line 401 are shown in FIG. 22, 1,024 memory elements are connected to the bit line 401 in the side wall memory array 310 (FIG. 20). Also, 512 bit lines are provided in the side wall memory array 310 (FIG. 20).

The column selector 332 comprises a first selection transistor 462 connected to the bit line 401, and a second selection transistor 464 connected to the first selection transistor 462. In FIG. 22, the column selector 332 is shown to have only two selection transistors (i.e., the first selection transistor 462 and the second selection transistor 464). The column selector 332 may comprise a plurality of selection transistors for each bit line as in known techniques.

The drain of the first selection translator 462 ls connected to the bit line 401. The source of the first selection transistor 462 is connected to the drain of the second selection transistor 464. The source of the second selection translator 464 is connected to the line 356.

The gate of the first selection transistor 462 and the gate of the second selection transistor 464 are connected via the line 328 to the column decoder 325. As described above with respect to FIG. 20 the write state machine 455 outputs an address signal to the column decoder 325. Therefore, the first selection transistor 462 and the second selection transistor 464 are switched ON or OFF in accordance with the address signal.

The reset portion 340 is used to minimize a time period between a rewrite operation with respect to a memory element of the side wall memory array 310, and a verify operation for the rewrite operation.

The rewrite operation includes a write operation with respect to a memory element and an erase operation with respect to a memory element.

The verify operation is to verify whether or not a rewrite operation has been performed correctly. A rewrite operation is verified by reading data from a memory element, in which a rewrite operation has been performed.

The reset portion 340 comprises a reset transistor 450. The reset transistor 450 is called an equalization transistor 450. The reset translator 450 is a grounding transistor. The reset transistor 450 ls, for example, a CMOS field effect transistor.

The gate of the reset transistor 450 is connected to the write state machine 455 via a line 452. The write state machine, 455 output an HDGNDSEN signal (reset signal) via the line 452 to the gate of the reset transistor 450. The reset transistor 450 is switched ON or OFF in accordance with an HDGNDSEN signal (reset signal) output from the write state machine 455. The source of the reset transistor 450 is connected to ground.

The drain of the reset transistor 450 is connected via the line 356 to the sense amplifier 360, the pull-up portion 350 and the column selector 332.

The pull-up portion 350 comprises a first pull-up transistor 471, a second pull-up transistor 472, and a third pull-up transistor 473.

A rewrite voltage Vpp (e.g., about 12 volts) is applied to the drain of the first pull-up transistor 471.

The gate of the first pull-up transistor 471 and the gate of the second pull-up transistor 472 are connected to each other via a line 474. A HHDATAB0 signal (rewrite signal) output from the write state machine 456 is supplied via the line 474 to the gate of the first pull-up transistor 471 and the gate of the second pull-up transistor 472.

The source of the first pull-up transistor 471 is connected to the drain of the second pull-up transistor 472.

A prescribed voltage (e.g., 5 volts) to applied to the drain and gate of the third pull-up transistor 473.

To perform a write operation with respect to a memory element contained in the side wall memory array 310, the write state machine 455 outputs an HHDATAB0 signal (rewrite signal) to the pull-up portion 350.

When the HHDATAB0 signal (rewrite signal) is logic HIGH, a write operation is performed with respect to a memory element. In this case, the first pull-up transistor 471 and the second pull-up transistor 472 is turned ON, so that a rewrite voltage Vpp is applied to the line 356.

Next, when the first selection transistor 462 and the second selection transistor 464 are turned ON, the line 356 to connected via the column selector 332 to the bit line 401. As a result, the voltage Vpp is applied to the drain electrodes of the memory element 421, the memory element 425 and the memory element 429 connected to the bit line 401. In this state, when a voltage is applied to any one of the word lines 411, 412 and 413, a write operation is performed with respect to a corresponding one of the memory elements 421, 425 and 429. The write operation is performed with respect to a memory element as described above.

Next, the bit line 401, to which a rewrite voltage has been applied, is grounded.

When the write state machine 455 outputs an HDGNDSEN signal (reset signal) via the line 452 to the reset transistor 450, the reset translator 450 is turned ON, so that the line 356 is grounded. Next, when both the first selection transistor 462 and the second selection transistor 464 are turned ON, the line 356 is connected to the bit line 401, so that the drain electrodes of the memory elements 421, 425 and 429 connected to the bit line 401 are grounded.

The pulse length of the HDGNDSEN signal (reset signal) ls, for example, 0.5 microsecond.

When the HDGNDSEN signal (reset signal) causes the reset transistor 450 to be turned ON, the source and drain of the reset transistor 450 are conductive to each other. When both the first selection transistor 462 and the second selection transistor 464 are turned ON, the line 356 connected to the reset translator 450 is connected to a selected bit line (here, the bit line 401), the selected bit line is grounded.

A time period during which the selected bit line is grounded, is substantially the same as a time period during which the reset transistor 450 is turned ON (i.e., a time period during the reset transistor 450 is turned ON, so that a direct path to ground is provided).

When the HDGNDSEN signal (reset signal) is applied to the gate of the reset transistor 450, the reset transistor 450 is turned ON. As a result, the bit line 401 is grounded.

Next, it is verified whether or not a write operation with respect to a memory element has been performed.

The previous write operation to verified by applying a voltage to a word line in the side wall memory array 310 to read charges retained in a memory element to which the write operation has been performed.

Read voltages are supplied to the gate electrode, the source electrode and the drain electrode of a selected memory element to be read. Specifically, these read voltages are the following.

Of the order of 1.8 volts is applied via the bit line 401 to the drain electrode of a memory element to be read.

Of the order of 2 volts to applied to the gate electrode of a memory element to be read. In other words, Of the order of 2 volts is applied to a word line connected to the gate electrode of a memory element to be read.

The source electrode of a memory element to be read is grounded.

In this manner, it is verified whether or not a write operation has been performed correctly.

As described above, generally, a rewrite voltage applied to a bit line for a write operation is greater than a voltage applied to a bit line for a verify operation (read operation).

In Embodiment 10, about 2.0 microseconds is required for verifying whether or not a write operation has been performed correctly.

In another embodiment, about 0.2 microseconds is required for verifying whether or not a write operation has been performed correctly.

In other alternative embodiments, a time required for verifying may be shorter or longer.

In Embodiment 10, a total time required for performing a write operation with respect to a memory element, grounding a bit line to the memory element, and verifying the write operation with respect to the memory element, is about 12.5 microseconds. Specifically, 10 microseconds is required for performing a write operation with respect to a memory element, 0.5 microseconds is required for grounding a bit line to the memory element, and 2.0 microseconds is required for verifying the write operation with respect to the memory element.

According to Embodiment 10, the write state machine 455 performs a write operation with respect to a memory element. Next, the reset portion 340 grounds a bit line connected to the memory element. Thereafter, the write operation is verified. Thus, a read voltage can be applied to a bit line without waiting for spontaneous discharge, thereby making it possible to shorten a time required for accessing a memory element.

In the above description, a write operation is performed with respect to a memory element before the write operation is verified. Embodiment 10 can be applied to the case where an erase operation is performed with respect to a memory element before the erase operation is verified.

This is because an erase operation is performed in the same manner as that for a write operation, except that the polarity of a voltage applied to the gate electrode of a memory element during the erase operation is opposite to that the write operation, as will be understood with reference to FIGS. 4 and 5.

Embodiment 11

Figure 23:
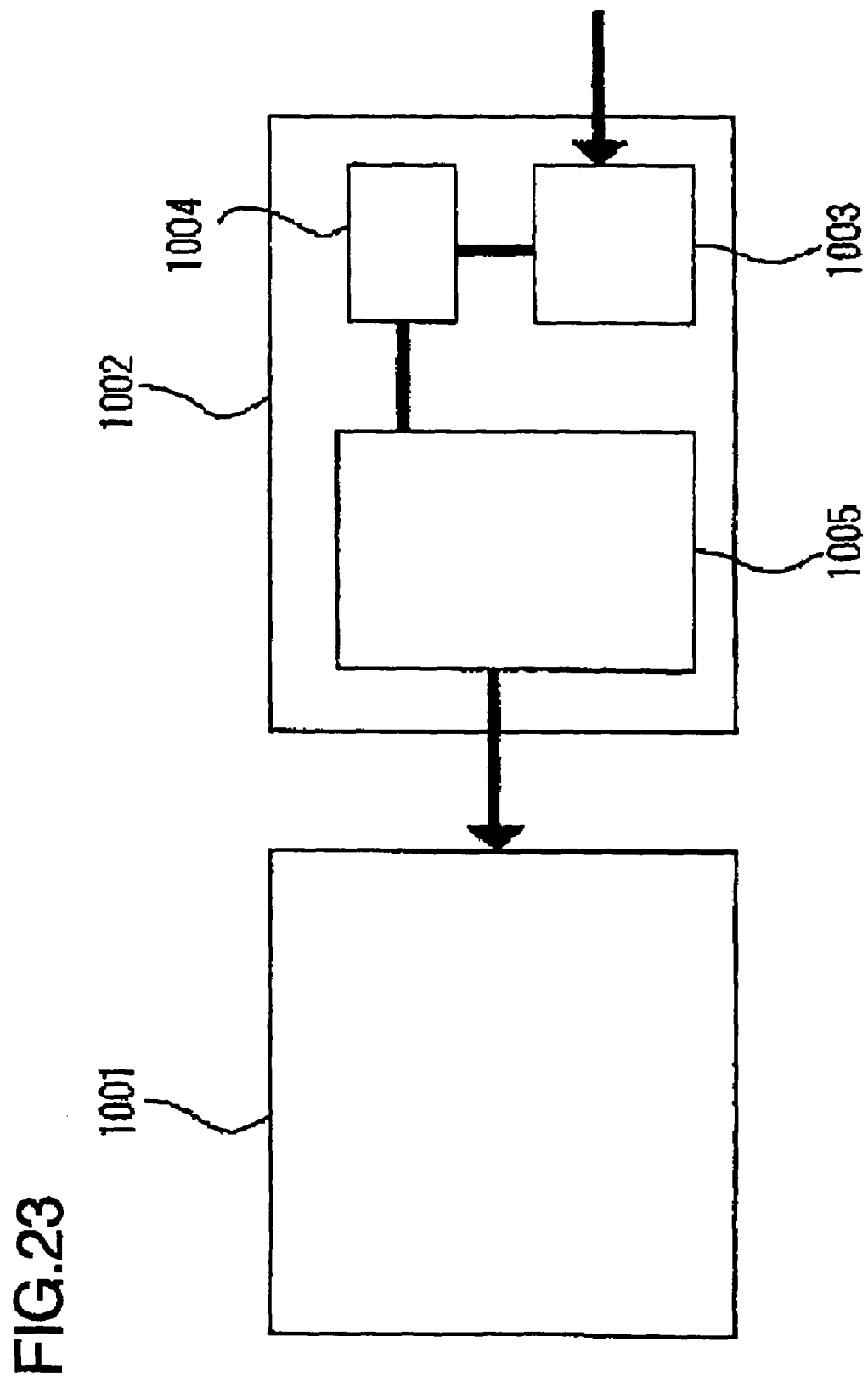
FIG. 23 is a schematic diagram showing a configuration of a liquid crystal display apparatus according to Embodiment 11, comprising a semiconductor storage device of the present invention.

The above-described semiconductor storage device may be applied to, for example, a rewritable non-volatile memory for adjusting an image on a liquid crystal panel as shown in FIG. 23.

A liquid crystal panel 1001 is driven by a liquid crystal driver 1002. The liquid crystal driver 1002 comprises a non-volatile memory portion 1003, an SRAM portion 1004, and a liquid crystal driver circuit 1005. The non-volatile memory portion comprises the memory element of the present invention, more preferably a semiconductor storage device according to Embodiment 10. The non-volatile memory portion 1003 can be externally rewritten.

Information stored in the non-volatile memory portion 1003 is transcribed into the SRAM portion 1004 when the power of the apparatus is turned ON. The liquid crystal driver circuit 1005 can read information stored in the SRAM portion 1004 if required. By providing the SRAM portion 1004, the stored information can be read with high speed.

The liquid crystal driver 1002 may be provided external to the liquid crystal panel 1001 as shown in FIG. 23, or alternatively, may be provided on the liquid crystal panel 1001.

Liquid crystal panels display gray scale images, which are varied by applying multiple levels of voltages to each pixel. Generally, there are variations among products in the correspondence between applied voltages and displayed gray levels. To address this problem, Information for compensating for variations in individual products is stored after completion of the product, and based on the information, compensation is performed. Thereby, image quality can be made uniform among products. Therefore, a rewritable non-volatile memory for storing correction information is preferably carried on the product. As the non-volatile memory, the memory element of the present invention is preferably used, particularly a semiconductor storage device according to Embodiment 10, with which the memory elements of the present invention are integrated.

When the memory element of the present invention is used as a non-volatile memory for adjusting an image on a liquid crystal panel, a process for integrating it with a circuit, such as a liquid crystal driver or the like, can be easily achieved, leading to a reduction in manufacturing cost. The semiconductor storage devices of Embodiment 10 are particularly suitable when a memory size is relatively small and the reliability or stability is valued. This is because the outputs of two memory elements (memory element pair) are input to the same sense amplifier, so that a difference between currents passing through the two memory elements having similar device structures can be detected, thereby performing a read operation reliably and stably. Therefore, an area per bit is large. However, when a memory size is small, the large area per bit of the semiconductor storage device can be accepted as compared to the areas of other circuits. A typical non-volatile memory for adjusting an image on a liquid crystal panel has a size of, for example, several kilobytes, i.e., a relatively small memory size, therefore, the semiconductor storage devices of Embodiment 10 are particularly preferably used as non-volatile memories for adjusting an image on a liquid crystal panel.

Embodiment 12

Figure 24:
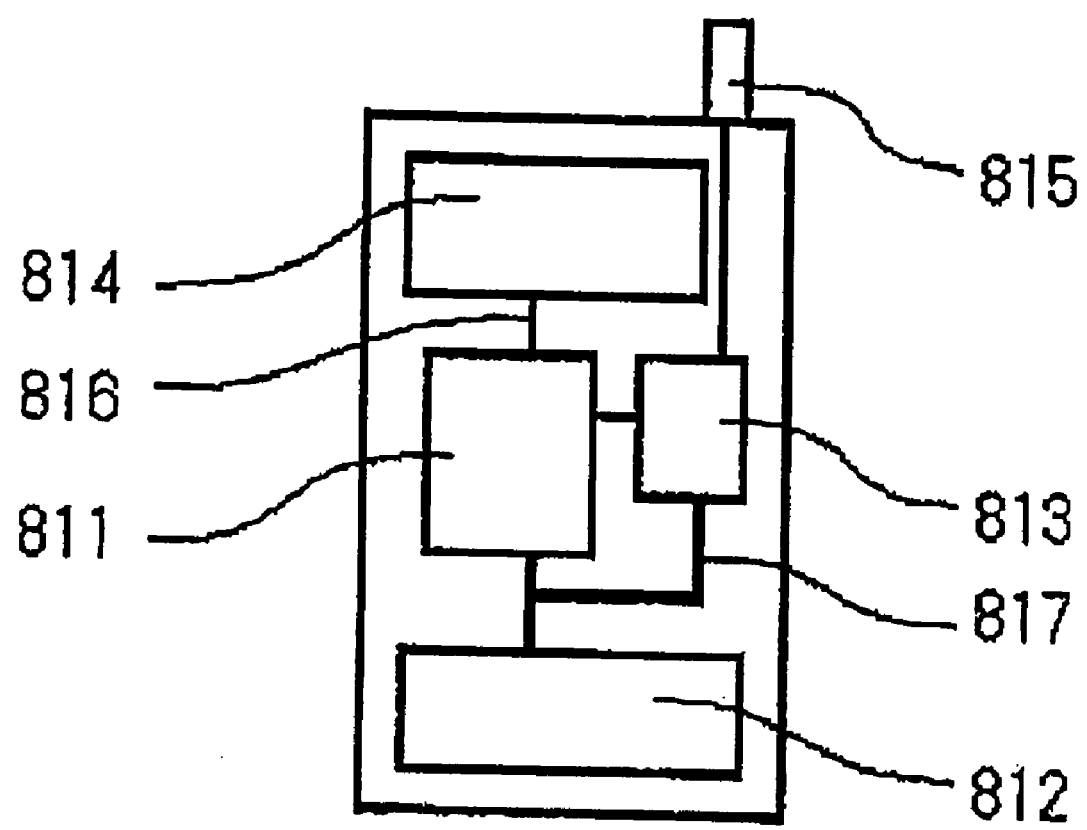
FIG. 24 is a schematic diagram showing a configuration of a mobile electronic apparatus according to Embodiment 12, comprising a semiconductor storage device of the present invention.

A mobile telephone, which is a mobile electronic apparatus comprising the above-described semiconductor storage device, is shown in FIG. 24.

The mobile telephone comprises a control circuit 811, a battery 812, an RF (radio frequency) circuit 813, a display portion 814, an antenna 815, a signal line 816, a power supply line 817, and the like. The control circuit 811 comprises the above-described semiconductor storage device of the present invention. Note that the control circuit 811 may be preferably an integrated circuit in which elements having the same structure as described in Embodiment 10 are used both as memory circuit elements and as logic circuit elements. As a result, the manufacture of integrated circuits can be facilitated, leading to a reduction in the manufacturing cost of mobile electronic apparatuses.

As described above, by using a semiconductor storage device in a mobile electronic apparatus, in which a memory portion and a logic circuit portion can be easily integrated together and a high-speed read operation can be obtained, the operation speed of the mobile electronic apparatus can be increased and the manufacturing cost can be reduced. Therefore, it is possible to obtain an inexpensive, highly reliable, high-performance mobile electronic apparatus.

According to the semiconductor storage device of the present invention, a write state machine applies a first voltage for performing a write operation or an erase operation with respect to a memory elements, to the memory element via a bit line connected thereto, and thereafter, the reset portion connects the bit line connected to the memory element to ground. Thereafter, the write state machine applies a second voltage for verifying whether or not the write operation or the erase operation has been performed with respect to the memory element, to the memory element via the same bit line. Thereby, a time required for verifying an operation with respect to a memory element can be shortened, so that a time required for accessing to the memory element can be reduced.

Each memory element in a memory array contained in the semiconductor storage device according to the present invention comprises a gate electrode provided via a gate insulating film on a semiconductor layer, a channel region provided under the gate electrode, diffusion regions provided on opposite sides of the channel region and having a conductivity type opposite to that of the channel region, and memory function sections provided on opposite sides of the gate electrode and having a function of retaining charges. Therefore, the memory element can be formed by a process having high affinity to a standard process for typical transistors.

Therefore, the memory element can be formed by a process having high affinity to a standard process for typical transistors. Therefore, as compared with when a conventional flash memory is used as anon-volatile memory element and the flash memory and a peripheral circuit comprising a typical transistor are integrated together, the semiconductor storage device of the prevent invention can dramatically reduce the number of masks and the number of processing steps. Therefore, the yield of a chip can be improved, thereby reducing manufacturing cost.

The memory function section of each of the plurality of memory elements preferably comprises a charge retaining film having a function of retaining charges. The charge retaining film preferably extends substantially parallel to a side of the gate electrode. Thereby, the rewrite rate is increased. The semiconductor layer of each of the plurality of memory elements preferably has a region in a vicinity of the diffusion region, the region having a concentration higher than that of a vicinity of a surface of the semiconductor layer under the gate electrode. Thereby, the rewrite rate is increased.

Thus, the memory element of the present invention has a rewriting rate higher than that of conventional flash memories. Therefore, a rewrite operation can be completed quickly as compared to when the rewriting procedure described in the embodiment above to applied to conventional flash memories.

According to a mobile electronic apparatus according to the present invention, the above-described semiconductor storage device is provided therein. Therefore, it is easy to integrate a memory portion and a logic circuit portion together. Thereby, the operating speed of the mobile electronic apparatus can be improved, resulting in a reduction in manufacturing cost. As a result, an inexpensive, highly reliable, mobile electronic apparatus can be obtained.

Various other modifications will be apparent to and can be readily made by those skilled in the art without departing from the scope and spirit of this invention. Accordingly, it ls not intended that the scope of the claims appended hereto be limited to the description as set forth herein, but rather that the claims be broadly construed.

What is claimed is:

1. A semiconductor storage device, comprising:
    a memory array comprising a plurality of memory elements;
    a write state machine for applying a first voltage for performing a write operation or an erase operation, with respect to one of the plurality of memory elements, to the one memory element via a bit line connected thereto, and thereafter, applying a second voltage for verifying whether or not the write operation or the erase operation has been performed, with respect to the one memory element, to the one memory element via the bit line connected thereto; and
    a reset portion for grounding the bit line connected to the one memory element after the write state machine has applied the first voltage and before the write state machine has applied the second voltage,
    wherein at least one of the plurality of memory elements is a multi-level memory element and comprises a gate electrode provided via a gate insulating film on a semiconductor layer, a channel region provided under the gate electrode, diffusion regions provided on opposite sides of the channel region and having a conductivity type opposite to that of the channel region, and memory function sections provided on opposite sides of the gate electrode and having a function of retaining charges independent of one another, and
    wherein each memory function section is formed by at least one of an insulating film including an insulator having a function of retaining charges, an insulating film including at least one conductor or semiconductor dot, and an insulating film including a ferroelectric film in which inner charge is polarized by an electric field and in which a charge polarization state is held.

2. A semiconductor storage device according to claim 1, wherein in each of the plurality of memory elements, one of the diffusion regions is connected to a corresponding one of a plurality of bit lines,
    the semiconductor storage device further comprises:
    a column selector for selecting one of the plurality of bit lines.

3. A semiconductor storage device according to claim 2, wherein the column selector comprises:
a first selection transistor comprising a gate, a source, and a drain, the drain being connected to one of the plurality of bit lines; and
a second selection transistor comprising a gate, a source, the source being connected to the reset portion, and a drain, the drain being connected to the source of the first selection transistor,
wherein the first selection transistor and the second selection transistor are switched in accordance with a signal input to the gate of the first selection transistor and the gate of the second selection transistor to connect one of the a plurality of bit lines with the reset portion.

4. A semiconductor storage device according to claim 3, further comprising a pull-up portion for applying a rewrite voltage to one of the plurality of bit lines.

5. A semiconductor storage device according to claim 4, wherein the pull-up portion comprises:
a first pull-up transistor comprising a gate, a source, and a drain, wherein a rewrite signal is input to the gate and the rewrite voltage is applied to the drain;
a second pull-up transistor comprising a gate, a source, and a drain, wherein the rewrite signal is input to the gate, the source is connected to the reset portion, and the drain is connected to the source of the first pull-up transistor; and
a third pull-up transistor comprising a gate, a source, and a drain, wherein a prescribed voltage is applied to the gate, a prescribed voltage is applied to the source, and the drain is connected to the source of the first pull-up transistor.

6. A semiconductor storage device according to claim 1, wherein the reset portion comprises a reset transistor comprising a gate, a source, and a drain, wherein the gate receives a reset signal output from the write state machine, the source is connected to ground, and the drain is connected to at least one of the plurality of bit lines.

7. A semiconductor storage device according to claim 5, wherein the write state machine outputs the rewrite signal to the first pull-up transistor to apply a rewrite voltage to a bit line corresponding to the one memory element and a voltage to the gate electrode of the one memory element.

8. A semiconductor storage device according to claim 6, wherein the write state machine outputs the reset signal for about 0.5 microseconds after outputting the rewrite signal.

9. A semiconductor storage device according to claim 6, wherein the write state machine verifies whether or not a write operation or an erase operation has been performed with respect to the one memory element by applying a second voltage to the drain electrode of the one memory element after outputting the reset signal.

10. A semiconductor storage device according to claim 9, wherein the second voltage is about one volt.

11. A semiconductor storage device according to claim 1, wherein the memory function section of each of the plurality of memory elements comprises a charge retaining film having a function of retaining charges, and the charge retaining film extends substantially parallel to a side of the gate electrode.

12. A semiconductor storage device according to claim 1, wherein the semiconductor layer of each of the plurality of memory elements has a region in a vicinity of the diffusion region, the region having a P-type concentration higher than that of a vicinity of a surface of the semiconductor layer under the gate electrode.

13. A mobile electronic apparatus, comprising a semiconductor storage device according to claim 1.

14. A method for controlling a semiconductor storage device comprising a plurality of memory elements, the method comprising the steps of:
applying a first voltage for performing a write operation or an erase operation, with respect to one of the plurality of memory elements, to the one memory element via a bit line connected thereto;
grounding, after the first voltage applying step, the bit line connected to the one memory element; and
applying, after the grounding step, a second voltage for verifying whether or not the write operation or the erase operation has been performed, with respect to the one memory element, to the one memory element via the bit line connected thereto,
wherein at least one of the plurality of memory elements is a multi-level memory element and comprises a gate electrode provided via a gate insulating film on a semiconductor layer, a channel region provided under the gate electrode, diffusion regions provided on opposite sides of the channel region and having a conductivity type opposite to that of the channel region, and memory function sections provided on opposite sides of the gate electrode and having a function of retaining charges independent of one another, and
wherein each memory function section is formed by at least one of an insulating film including an insulator having a function of retaining charges, an insulating film including at least one conductor or semiconductor dot, and an insulating film including a ferroelectric film in which inner charge is polarized by an electric field and in which a charge polarization state is held.

15. A method according to claim 14, wherein the step of applying the first voltage for performing a write operation or an erase operation comprises the step of applying a voltage for performing the write operation.

16. A method according to claim 14, wherein the step of applying the first voltage for performing a write operation or an erase operation comprises the step of applying a voltage for performing the erase operation.

17. A semiconductor storage device according to claim 1, wherein the gate electrode includes a first sidewall and a second sidewall, and a first memory function section of the memory function sections is formed along at least a portion of the first sidewall, and a second memory function section of the memory function sections is formed along at least a portion of the second sidewall.

18. A semiconductor storage device according to claim 1, wherein one memory function section can store two or more-level information.

19. A semiconductor storage device according to claim 1, wherein one memory element can store four or more-level information.

20. A semiconductor storage device according to claim 1, wherein a distance from one end of the gate electrode to the nearer diffusion region in the gate longitudinal direction is shorter than a thickness of a charge retaining film of the memory function section in a direction parallel to the gate longitudinal direction.

21. A semiconductor storage device according to claim 1, wherein at least a portion of the memory function section overlaps a portion of the diffusion region.

22. A semiconductor storage device according to claim 21, wherein the overlap amount of the memory function section and the diffusion region is greater than 10 nm.

23. A semiconductor storage device according to claim 1, wherein each diffusion region is disposed so as to be offset from an end of the gate electrode.

24. A semiconductor storage device according to claim 23, wherein the offset between each diffusion region and the end of the gate electrode is less than 100 nm.

25. A semiconductor storage device according to claim 23, wherein the writing or erasing operation to select one memory function section formed on both sides of the gate electrode can be executed independently from the other unselected one by controlling each voltage applied to the diffusion regions and the gate electrode.

26. A method according to claim 14, wherein at least a portion of the memory function section overlaps a portion of the diffusion region.

27. A method according to claim 26, wherein the overlap amount of the memory function section and the diffusion region is greater than 10 nm.

28. A method according to claim 14, wherein each diffusion region is disposed so as to be offset from an end of the gate electrode.

29. A method device according to claim 28, wherein the offset between each diffusion region and the end of the gate electrode is less than 100 nm.

30. A method according to claim 28, wherein the writing or erasing operation to select one memory function section formed on both sides of the gate electrode can be executed independently from the other unselected one by controlling each voltage applied to the diffusion regions and the gate electrode.

* * * * *